(12) United States Patent
Sasaki et al.

(10) Patent No.: US 7,217,344 B2
(45) Date of Patent: May 15, 2007

(54) TRANSPARENT CONDUCTIVE FILM FOR FLAT PANEL DISPLAYS

(75) Inventors: Yukihiko Sasaki, Claremont, CA (US); Xiao-Ming He, Arcadia, CA (US)

(73) Assignee: Streaming Sales LLC, Las Vegas, NV (US)

( * ) Notice: Subject to any disclaimer, the term of this patent is extended or adjusted under 35 U.S.C. 154(b) by 320 days.

(21) Appl. No.: 10/286,205

(22) Filed: Nov. 1, 2002

(65) Prior Publication Data

US 2004/0086717 A1 May 6, 2004
US 2007/0026232 A9 Feb. 1, 2007

(51) Int. Cl.
*C23C 14/00* (2006.01)
*C23C 14/06* (2006.01)
*C23C 14/34* (2006.01)
*B05D 5/12* (2006.01)

(52) U.S. Cl. ............................ 204/192.26; 204/192.1; 427/123; 427/125; 427/126.3; 427/255.5

(58) Field of Classification Search ............ 427/126.1, 427/123, 126.3, 74, 75, 124, 125, 255.5; 204/192.1, 192.11, 192.12, 192.14, 192.26, 204/192.27, 192.29, 192.38; 349/147, 139
See application file for complete search history.

(56) References Cited

U.S. PATENT DOCUMENTS

| | | | |
|---|---|---|---|
| 5,667,853 A * | 9/1997 | Fukuyoshi et al. | 428/1.62 |
| 5,703,436 A | 12/1997 | Forrest et al. | |
| 6,125,226 A | 9/2000 | Forrest et al. | |
| 6,811,815 B2 * | 11/2004 | He et al. | 427/248.1 |
| 2002/0022156 A1 * | 2/2002 | Bright | 428/698 |
| 2002/0086164 A1 * | 7/2002 | Anzaki et al. | 428/432 |
| 2002/0110673 A1 | 8/2002 | Heydarpour et al. | |
| 2002/0163614 A1 | 11/2002 | Hinata et al. | |

FOREIGN PATENT DOCUMENTS

EP   1 043 606 A1   10/2000
WO   WO 00/26973 A   5/2000

OTHER PUBLICATIONS

Kim, J.-Y., Sohn, D., Kim, E.-R., "Polymer-Based Multi-Layer Conductive Electrode Film for Plastic LCD Applications," Appl. Phys. A, Applied Physics A (Materials Science Processing), Jun. 2001, Springer-Verlag, Germany, vol. 72, No. 6, Apr. 26, 2001, pp. 699-704.

Kloppel, A. et al., "Influence of Substrate Temperature and Sputtering Atmosphere on Electrical and Optical Properties of Double Silver Layer Systems," Thin Solid Films, Elsevier-Sequoia S.A. Lausanne, CH, vol. 392, No. 2, Jul. 30, 2001, pp. 311-314.

* cited by examiner

*Primary Examiner*—Michael E. Lavilla
(74) *Attorney, Agent, or Firm*—Schwabe, Williamson & Wyatt, P.C.

(57) ABSTRACT

Substrates having films are used to produce flat panel displays and similar devices. Various embodiments of transparent conductive films and methods for the same for flat panel displays and similar devices are disclosed herein.

41 Claims, 9 Drawing Sheets

TRANSPARENT CONDUCTIVE FILM FOR FLAT PANEL DISPLAYS

RELATED APPLICATIONS

The instant application is a continuation-in-part of Ser. No. 10/172,282, filed Jul. 14, 2002.

BACKGROUND OF THE INVENTION

1. Field of the Invention

The present invention relates generally to transparent conductive layers (TCL) used for flat panel displays, solar panels, emissive backlight constructions, and the like.

2. General Background and State of the Art

A liquid crystal display (LCD) is a type of flat panel display used in various electronic devices. Generally, LCDs comprise two sheets of polarizing material with a liquid crystal solution therebetween. Each sheet of polarizing material typically comprises a substrate of glass or transparent plastic; a liquid crystal (LC) is used as optical switches. The substrates are usually manufactured with transparent electrodes, typically made of indium tin oxide (ITO) or another conductive metallic layer, in which electrical "driving" signals are coupled. The driving signals induce an electric field which can cause a phase change or state change in the LC material, the LC exhibiting different light-reflecting characteristics according to its phase and/or state.

Liquid crystals can be nematic, smectic, or cholesteric depending upon the arrangement of the molecules. A twisted nematic cell is made up of two bounding plates (usually glass slides or plastic plates), each with a transparent conductive coating (such as ITO or another conductor) that acts as an electrode, spacers to control the cell gap, two cross polarizers (the polarizer and the analyzer), and nematic liquid crystal material. Twisted nematic displays rotate the direction of the liquid crystal by 90°. Super-twisted nematic displays employ up to a 270° rotation. This extra rotation gives the crystal a much deeper voltage-brightest response, also widens the angle at which the display can be viewed before losing much contrast. Cholesteric liquid crystal (CLC) displays are normally reflective (meaning no backlight is needed) and can function without the use of polarizing films or a color filter. "Cholesteric" means the type of liquid crystal having finer pitch than that of twisted nematic and super-twisted nematic. Sometimes it is called "chiral nematic" because cholesteric liquid crystal is normally obtained by adding chiral agents to host nematic liquid crystals. Cholesteric liquid crystals may be used to provide bistable and multistable displays that, due to their non-volatile "memory" characteristic, do not require a continuous driving circuit to maintain a display image, thereby significantly reducing power consumption. Ferroelectric liquid crystals (FLCs) use liquid crystal substances that have chiral molecules in a smectic C type of arrangement because the spiral nature of these molecules allows the microsecond switching response time that makes FLCs particularly suited to advance displays. Surface-stabilized feroelectric liquid crystals (SSFLCs) apply controlled pressure through the use of a glass plate, suppressing the spiral of the molecules to make the switching even more rapid.

Some known LCD devices include chemically-etched transparent, conductive layers overlying a glass substrate. See, e.g., U.S. Pat. No. 5,667,853 to Fukuyoshi et al., incorporated herein by reference. Unfortunately, chemical etching processes are often difficult to control, especially for plastic films. Such processes are also not well-suited for production of the films in a continuous, roll-to-roll manner, on plastic substrates.

There are alternative display technologies to LCDs that can be used, for example, in flat panel displays. A notable example is organic or polymer light-emitting devices (OLEDs) or (PLEDs), which are comprised of several layers in which one of the layers is comprised of an organic material that can be made to electroluminesce by applying a voltage across the device. An OLED device is typically a laminate formed in a substrate such as glass or a plastic polymer. A light-emitting layer of a luminescent organic solid, as well as adjacent semiconductor layers, are sandwiched between an anode and a cathode. The semiconductor layers can be hole-injecting and electron-injecting layers. PLEDs can be considered a subspecies of OLEDs in which the luminescent organic material is a polymer. The light-emitting layers may be selected from any of a multitude of light-emitting organic solids, e.g., polymers that are suitably fluorescent or chemiluminescent organic compounds. Such compounds and polymers include metal ion salts of 8-hydroxyquinolate, trivalent metal quinolate complexes, trivalent metal bridged quinolate complexes, Schiff-based divalent metal complexes, tin (IV) metal complexes, metal acetylacetonate complexes, metal bidenate ligand complexes incorporating organic ligands, such as 2-picolylketones, 2-quinaldylketones, or 2-(o-phenoxy) pyridine ketones, bisphosphonates, divalent metal maleonitriledithiolate complexes, molecular charge transfer complexes, rare earth mixed chelates, (5-hydroxy) quinoxaline metal complexes, aluminum tris-quinolates, and polymers such as poly(p-phenylenevinylene), poly(dialkoxyphenylenevinylene), poly(thiophene), poly(fluorene), poly(phenylene), poly(phenylacetylene), poly(aniline), poly(3-alkylthiophene), poly(3-octylthiophene), and poly(N-vinylcarbazole). When a potential difference is applied across the cathode and anode, electrons from the electron-injecting layer and holes from the hole-injecting layer are injected into the light-emitting layer; they recombine, emitting light. OLEDs and PLEDs are described in the following United States patents, all of which are incorporated herein by this reference: U.S. Pat. No. 5,707,745 to Forrest et al., U.S. Pat. No. 5,721,160 to Forrest et al., U.S. Pat. No. 5,757,026 to Forrest et al., U.S. Pat. No. 5,834,893 to Bulovic et al., U.S. Pat. No. 5,861,219 to Thompson et al., U.S. Pat. No. 5,904,916 to Tang et al., U.S. Pat. No. 5,986,401 to Thompson et al., U.S. Pat. No. 5,998,803 to Forrest et al., U.S. Pat. No. 6,013,538 to Burrows et al., U.S. Pat. No. 6,046,543 to Bulovic et al., U.S. Pat. No. 6,048,573 to Tang et al., U.S. Pat. No. 6,048,630 to Burrows et al., U.S. Pat. No. 6,066,357 to Tang et al., U.S. Pat. No. 6,125,226 to Forrest et al., U.S. Pat. No. 6,137,223 to Hung et al., U.S. Pat. No. 6,242,115 to Thompson et al., and U.S. Pat. No. 6,274,980 to Burrows et al.

In a typical matrix-address light-emitting display device, numerous light-emitting devices are formed on a single substrate and arranged in groups in a regular grid pattern. Activation may be by rows and columns, or in an active matrix with individual cathode and anode paths. OLEDs are often manufactured by first depositing a transparent electrode on the substrate, and patterning the same into electrode portions. The organic layer(s) is then deposited over the transparent electrode. A metallic electrode can be formed over the electrode layers. For example, in U.S. Pat. No. 5,703,436 to Forrest et al., incorporated herein by reference, transparent indium tin oxide (ITO) is used as the hole-injecting electrode, and a Mg—Ag-ITO electrode layer is used for electron injection.

Previous methods of manufacturing such films have not succeeded in manufacturing such films by a continuous process on flexible substrates, yielding films with desirable properties such as high transmittance, low electrical resistance, and stability to temperature and humidity.

For example, PCT Publication No. WO 99/36261, by Choi et al. (Polaroid Corp.) published on Jul. 22, 1999, and incorporated by this reference, describes the deposition of ITO/Au/Ag/Au/ITO multilayered films on polymer (Arton substrate). In this multilayered structure, the Ag layer has a thickness of 10–15 nm and the two ITO layers have a thickness of 35–50 nm. As compared with ITO/Ag/ITO multilayered films, an Au/Ag/Au sandwiched layer works as a conductive layer in the multilayered structure and exhibits an enhanced corrosion resistance as the 1–1.5 nm Au layers prevent the water or oxygen from entering the Au/Ag interfacial area. It was reported that the ITO/Au/Ag/Au/ITO films have a sheet resistance below 10 Ω/square and a transmittance above 80%. However, the deposition process for these multilayered films is much more complicated than the deposition process for ITO/Ag/ITO films.

U.S. Pat. No. 5,667,853 to Fukuyoshi et al., incorporated herein by reference, describes the formation of InCeO/Ag/InCeO films in which the indium cerium oxide (InCeO or "ICO") layers have a thickness of about 35–50 nm and the Ag layer has a thickness of about 10–15 nm. The InCeO films were deposited by sputtering a target that was formed by doping 10–30% $CeO_2$ into $In_2O_3$. The cerium can effectively block the diffusion of oxygen atoms from the InCeO films to the InCeO/Ag interfacial layer. On the other hand, the Ag layer actually contains 1 atom percent Au and 0.5 atom percent Cu to enhance the stability of Ag atoms in the Ag layer. The design of the chemical compositions in both the InCeO and the Ag layers was reported to effectively improve the structural stability of the InCeO/Ag/InCeO films. The InCeO/Ag/InCeO films exhibit a low sheet resistance of 3–5 Ω/square and a high optical transmittance of above 90%. The deposition of InCeO/Ag/InCeO films was also disclosed in U.S. Pat. No. 6,249,082 to Fukuyoshi et al., incorporated by this reference. However, the deposition of these films was only performed on a rigid glass substrate. The invention was not applied to the actual manufacture of information displays.

Other methods for producing such films and the films thus produced are described in U.S. Pat. No. 4,166,876 to Chiba et al., U.S. Pat. No. 4,234,654 to Teijin, U.S. Pat. No. 4,345,000 to Kawazoe et al., U.S. Pat. No. 4,451,525 to Kawazoe et al., U.S. Pat. No. 4,936,964 to Nakamura, U.S. Pat. No. 5,178,957 to Kolpe et al., U.S. Pat. No. 6,171,663 to Hanada et al., U.S. Published patent Application No. US 2001/0050222 by Choi et al., PCT Patent Publication No. WO 98/12596 by Staral et al., European Patent Publication No. EP 1041644 by Cheung, and European Patent Publication No. EP 1155818, all of which are incorporated herein by this reference.

The technology disclosed in U.S. Pat. No. 5,667,853 employs silver (Ag) or a silver-gold alloy (Ag/Au) sandwiched between two layers of indium cerium oxide (InCeO). The Ag or Ag/Au alloy is susceptible to oxidation when exposed to air and in the presence of water and electrical voltage. Under these conditions, the metal tends to diffuse. This can cause electrical short circuits or visible stains, which damages the appearance of the display. The use of the InCeO layers is an improvement, making the Ag or Ag/Au construction much more stable and making the total layer transparent. However, for the purposes of flat panel displays, the electrode needs to be patterned by etching. The edged edge exposes the Ag or Ag/Au metal. Unless the metal is protected in some manner, the oxidation or corrosion might start from this location. Therefore, there is a need for a more stable construction for flat panel displays.

Moreover, Furukawa Metal (Tokyo, Japan) developed an alloy of silver which resist corrosion even after immersion in a salt water for 24 hours. The Alloy (APC) is Silver with small amount of Palladium and Copper (Silver 98%, Palladium 0.5% and copper 1.5%). This material is currently used for metallizing the digital video disc (DVD) or Comapct disc (CD) for improving reflectivity. This application require oxidation resistance for the life of DVD or CD. The use of this alloy for combination with the oxide layers to provide the optical transparency and to improves the stability of transparent conductive film even in a harsh condition of wet etching.

Accordingly, there is still a need for an improved construction for flat panel displays that avoids oxidation and corrosion.

INVENTION SUMMARY

One aspect of the present invention is a method for forming a composite film. In general, a method for forming a composite film according to the invention comprises:

(1) providing a flexible plastic substrate;
(2) depositing a multi-layered conductive metallic film comprising two layers of an alloy selected from the group consisting of indium cerium oxide (InCeO) and indium tin oxide (ITO) surrounding a layer of an alloy of silver, palladium, and copper (Ag/Pd/Cu [APC]) continuously on the flexible plastic substrate by a thin-film deposition technique; and
(3) collecting the composite film in continuous rolls.

Preferably, the alloy of silver, palladium, and copper comprises about 98% silver, 0.5% palladium, and 1.5% copper.

The thin-film deposition technique can be sputtering, ion beam deposition, chemical vapor deposition, ion beam enhanced deposition, and laser ablation deposition. A preferred thin film deposition technique is DC magnetron sputtering.

Typically, the DC magnetron sputtering is performed in an atmosphere that contains argon, and, optionally, oxygen. The oxygen concentration can be varied to optimize the properties of the thin film being deposited.

The method can further comprise the step of purging the surface of the flexible plastic substrate with plasma prior to film deposition. The method can also further comprise a post-deposition annealing step.

Typically, the flexible plastic substrate is polyethylene terephthalate (PET), polyethylene naphthalate (PEN), polyethersulfone (PES), polycarbonate (PC), polysulfone, a phenolic resin, an epoxy resin, polyester, polyimide, polyetherester, polyetheramide, cellulose acetate, aliphatic polyurethanes, polyacrylonitrile, polytetrafluoroethylenes, polyvinylidene fluorides, poly(methyl α-methacrylates) or an aliphatic or cyclic polyolefin. Aliphatic polyolefins include, but are not necessarily limited to, high density polyethylene (HDPE), low density polyethylene (LDPE), and polypropylene, including oriented polypropylene (OPP). Cyclic polyolefins include, but are not necessarily limited to, poly(bis(cyclopentadiene)). A preferred flexible plastic substrate is a cyclic polyolefin or a polyester. The flexible plastic substrate can be reinforced with a hard coating. Typically, the hard coating is an acrylic coating.

Another aspect of the present invention is a composite film formed by a process according to the present invention. Typically, a composite film formed according to the present invention has superior properties, including high optical transmittance, low electrical resistance, high surface smoothness, high stability to exposure to high temperature and high humidity, high interlayer adhesion, and wet and dry etchability.

A further aspect of the invention is a novel composite film comprising a three-layer metallic film coated or deposited on a flexible plastic substrate, wherein the composite film has a combination of properties including: transmittance of at least 80% throughout the visible region; an electrical resistance of no greater than about 20 Ω/square, preferably no greater than 10 Ω/square; a root-mean-square roughness of no greater than about 5 nm; and an interlayer adhesion between the three-layer film and the remainder of the composite film that is sufficiently great to survive a 180° peel adhesion test. Preferably, the composite film further includes a reinforcing hard coating, preferably an acrylic coating, between the three-layer metallic film and the flexible plastic substrate. The outer layers of the three-layer metallic film are indium tin oxide or indium cerium oxide, as described above; the interior layer is the alloy of silver, palladium, and copper, as described above.

A preferred embodiment of the composite film includes the following properties: transmittance of at least 90% throughout the visible region; an electrical resistance of no greater than about 5 Ω/square; and a root-mean-square roughness of no greater than about 2.5 nm.

Typically, the flexible plastic substrate of the composite film is polyethylene terephthalate (PET), polyethylene naphthalate (PEN), polyethersulfone (PES), polycarbonate (PC), polysulfone, a phenolic resin, an epoxy resin, polyester, polyimide, polyetherester, polyetheramide, cellulose acetate, aliphatic polyurethanes, polyacrylonitrile, polytetrafluoroethylenes, polyvinylidene fluorides, poly(methyl α-methacrylates) or an aliphatic or cyclic polyolefin, as described above. A preferred flexible plastic substrate is a cyclic polyolefin or a polyester.

Yet another aspect of the present invention is a multilayered electrode/substrate structure comprising an etched composite film made according to the present invention. The multilayered electrode/substrate structure can be an LCD, OLED or a PLED.

The conductive material can be a light-emitting polymer. The polymer can be poly(p-phenylenevinylene) (PPV), poly (dialkoxyphenylenevinylene), poly(thiophene), poly(fluorene), poly(phenylene), poly(phenylacetylene), poly (aniline), poly(3-alkylthiophene), poly(3-octylthiophene), or poly(N-vinylcarbazole).

Alternatively, the multilayered electrode/substrate structure can include a conductive material that is a luminescent organic or organometallic material. The luminescent organic or organometallic material can be selected from the group consisting of metal ion salts of 8-hydroxyquinolate, trivalent metal quinolate complexes, trivalent metal bridged quinolate complexes, Schiff base divalent metal complexes, tin (IV) metal complexes, metal acetylacetonate complexes, metal bidentate ligand complexes incorporating an organic ligand selected from the group consisting of 2 picolylketones, 2-quinaldylketones, and 2-(o-phenoxy) pyridine ketones, bisphosphonates, divalent metal maleonitriledithiolate complexes, molecular charge transfer complexes, rare earth mixed chelates, (5-hydroxy) quinoxaline metal complexes, and aluminum tris-quinolates.

BRIEF DESCRIPTION OF THE DRAWINGS

These and other features, aspects, and advantages of the present invention will become better understood with reference to the following description, appended claims, and accompanying drawings where:

FIG. 6(a) is sample 173-2 after annealing and aged treatment and FIG. 6(b) is sample 173-3 after the annealling treatment.

DETAILED DESCRIPTION OF THE PREFERRED EMBODIMENTS

Figure 1A:
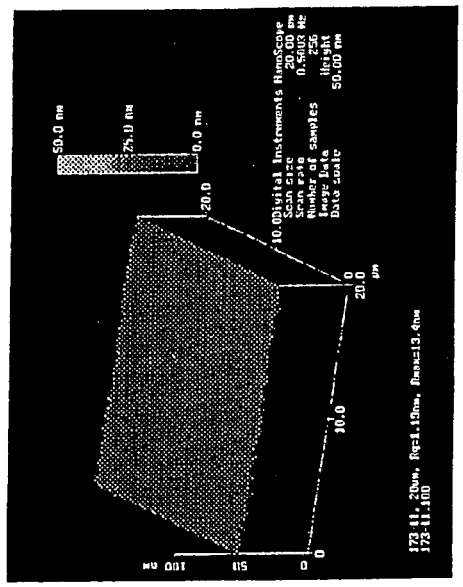
FIG. 1 is a diagram showing the results in two dimensions ((a). (c)) and three dimensions ((b), (d)) of a determination of surface morphology and roughness for two ITO/AgPdCu/ITO films of Example 1 determined by an Atomic Force Microscope ((a) and (b), sample 173-11; (c) and (d), sample 173-12, scan size 20×20 μM).
Figure 1C:
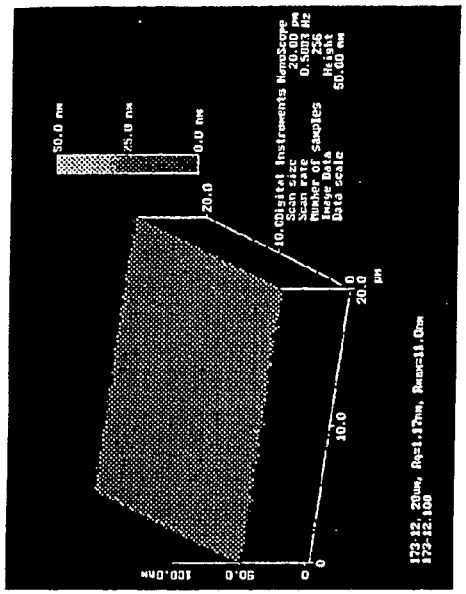
Figure 1B:
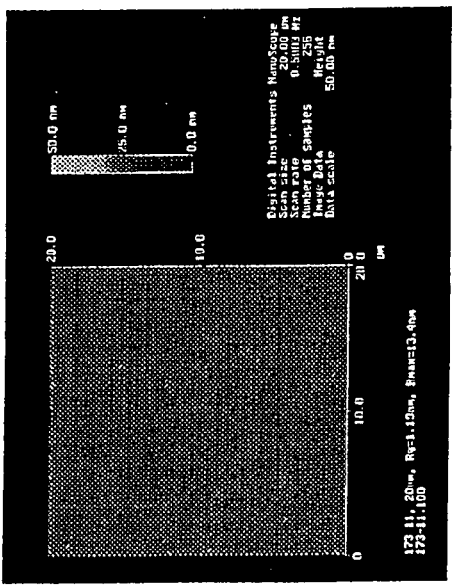
Figure 1D:
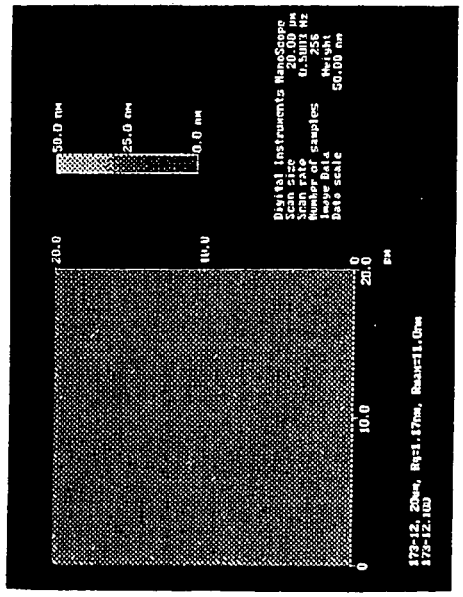

The invention provides a method for roll-to-roll deposition of highly conductive, transparent metallic films on flexible plastic substrates, for example to develop flexible display electrodes, and films produced by such methods. The films are particularly suitable for transparent conductive layers (TCL) used for flat panel displays, solar panels, emissive backlight constructions, and other applications.

The invention also provides for a composite film that has a balance of properties including transmittance of at least 80% throughout the visible region; an electrical resistance of no greater than about 20 Ω/square, more preferably no greater than about 10 Ω/square; a root-mean-square roughness of no greater than about 5 nm; and an interlayer adhesion between the metallic film and the remainder of the composite film that is sufficiently great to survive a 180° peel adhesion test. As used in the specification and claims of this patent application, "composite film" refers to flexible sheeting that is the composite of a thin conductive metallic film and a flexible plastic substrate on which the metallic film is deposited or formed. The preferred highly conductive, transparent metallic material comprises a three-layer film in which the two outer layers are an alloy selected from the group consisting of indium cerium oxide (InCeO) and indium tin oxide (ITO) and the interior layer is an alloy of silver, palladium, and copper (Ag/Pd/Cu). A particularly preferred alloy of silver, palladium, and copper comprises about 98% of silver, about 0.5% of palladium, and about 1.5% of copper. Preferably, the composite film further includes a reinforcing hard coating between the thin conductive metallic film and the flexible plastic substrate.

I. Methods for Roll-To-Roll Deposition

A. Thin-Film Deposition Methods

In general, a method for forming a composite film according to the present invention comprises:

(1) providing a flexible plastic substrate;

(2) depositing a multi-layered conductive metallic film as described above continuously on the flexible plastic substrate by a thin-film deposition technique to form a composite film; and (3) collecting the composite film in continuous rolls.

The outer layers of the multi-layered conductive metallic film are indium cerium oxide (InCeO) or indium tin oxide (ITO). The interior layer of the multi-layered conductive metallic film is an alloy of silver, palladium, and copper (Ag/Pd/Cu), as described above. Typically, the alloy of silver, palladium, and copper comprises from about 97% to about 99% of silver, from about 0.3% to about 0.8% of palladium, and from about 1.2% to about 1.8% of copper. Preferably, the alloy of silver, palladium, and copper comprises about 98.5% of silver, about 0.5% of palladium, and about 1.5% of copper.

The thin-film deposition technique can be sputtering, ion beam deposition, chemical vapor deposition, ion beam enhanced deposition, or laser ablation deposition. Preferably, the thin-film deposition technique is DC magnetron sputtering.

For DC magnetron sputtering, the sputtering is performed at a maximum sputter power of from about 300 watts to about 2000 watts. For the sputtering of ITO layers, preferably the sputter power is from about 600 watts to about 800 watts; more preferably, the sputter power is about 600 watts. For the sputtering of ICO layers, preferably, the sputter power is about 600 to 800 watts. For the sputtering of the Ag alloy layer, the sputter power is typically from about 60 watts to about 100 watts. When the exterior layers are ITO, the sputter power for the sputtering of the Ag alloy layer is preferably from about 70 watts to about 100 watts, more preferably from about 80 watts to about 100 watts. When the exterior layers are ICO, the sputter power for the sputtering of the Ag alloy layer is preferably from about 70 watts to about 90 watts.

Typically, the deposition distance for DC magnetron sputtering is from about 2 inches to about 12 inches. Preferably the deposition distance for DC magnetron sputtering is from about 9 inches to about 11 inches. More preferably, the deposition distance for DC magnetron sputtering is about 10 inches. The deposition distance can be adjusted to be optimal for the used deposition system.

Typically, the DC magnetron sputtering is performed in an atmosphere that contains argon, and, optionally, oxygen, and has a pressure of 2–4 mT or optimal to the used deposition chamber. Preferably, the atmosphere contains oxygen for the sputtering of ICO or ITO layers and contains argon only for the sputtering of Ag alloy layers. For the sputtering of ITO layers, more preferably, the flow rate of oxygen is from about 0.2 to about 3.75 standard cubic centimillitor. For the sputtering of ICO layers, more preferably, the flow rate of oxygen is about 0.2 to about 2.0 standard cubic centimillitor. Preferably, the flow rate of argon is from about 5.0 to about 20.0 standard cubic centimillitor. Still more preferably, the flow rate of argon is about 10 standard cubic centimillitor. The gas flows can also be adjusted to be optimal for the chamber size used and for the scale of the deposition process.

Typically, the line speed during deposition is up to 4 feet/min. For the sputtering of ITO layers, the line speed is preferably from about 0.3 feet/min to about 1.2 feet/min, more preferably from about 0.7 feet/min to about 1.0 feet/min. For the sputtering of ICO layers, the line speed is preferably from about 0.3 feet/min to about 1.2 feet/min, more preferably from about 0.7 feet/min to about 0.8 feet/min. For the sputtering of the Ag alloy layers, the line speed is preferably 0.7–0.8 feet/min. The line speed is adjusted to control the thickness of the ICO or ITO and the Ag/Pd/Cu layers in the deposition. The line speed can also be adjusted to be optimum for the target size used and for the scale of the deposition process.

In one preferred embodiment, deposition occurs on a 12-inch wide web of the flexible plastic substrate, there are four magnetron sputtering sources cooled by a source of cooling water, and the target is 6 inches in diameter. Other suitable arrangements are known.

B. Structure of the Composite Film

The thin conductive metallic film is a film with InCeO or ITO outer layers and an interior layer of an Ag/Pd/Cu alloy, as described above. Typically, the thickness of the InCeO or ITO layers is from about 10 nm to about 60 nm and the thickness of the Ag/Pd/Cu layer is from about 5 nm to about 20 nm. Preferably, the thickness of the InCeO or ITO layers is from about 30 nm to about 45 nm and the thickness of the Ag/Pd/Cu alloy layer is from about 12 nm to about 16 nm.

Typically, when the outer layers are InCeO, the InCeO layer has a composition close to that of the InCeO target and has an amorphous structure. After annealing, the InCeO film still has an amorphous structure.

The flexible plastic substrate can be any flexible self-supporting plastic film that supports the thin conductive metallic film. "Plastic" means a high polymer, usually made from polymeric synthetic resins, which may be combined with other ingredients, such as curatives, fillers, reinforcing agents, colorants, and plasticizers. Plastic includes thermoplastic materials and thermosetting materials.

The flexible plastic film must have sufficient thickness and mechanical integrity so as to be self-supporting, yet should not be so thick as to be rigid. Typically, the flexible plastic substrate is the thickest layer of the composite film (for example, 200 μm in thickness). Consequently, the substrate determines to a large extent the mechanical and thermal stability of the fully structured composite film. An exemplary preferred flexible substrate, therefore, is formed from a material that is stable at 130° C. for 6 hours, resistant to 1" mandrel tracking, and >2H pencil hardness.

Another significant characteristic of the flexible plastic substrate material is its Tg. Tg is defined as the glass transition temperature at which plastic material will change from the glassy state to the rubbery state. It may comprise a range before the material may actually flow. Suitable materials for the flexible plastic substrate include thermoplastics of a relatively low glass transition temperature (up to 150° C.), as well as materials of a higher glass transition temperature (above 150° C.). The choice of material for the flexible plastic substrate would depend on factors such as manufacturing process conditions (e.g. deposition temperature, and annealing temperature) and as well as post-manufacturing conditions (e.g. in a process line of a displays manufacturer). Certain of the plastic substrates discussed below can withstand higher processing temperatures of up to at least about 200° C. (some to 300°–350° C.) without damage.

Typically, the flexible plastic substrate is polyethylene terephthalate (PET), polyethylene naphthalate (PEN), polyethersulfone (PES), polycarbonate (PC), polysulfone, a phenolic resin, an epoxy resin, polyester, polyimide, polyetherester, polyetheramide, cellulose acetate, aliphatic polyurethanes, polyacrylonitrile, polytetrafluoroethylenes, polyvinylidene fluorides, poly(methyl α-methacrylates) or an aliphatic or cyclic polyolefin. Aliphatic polyolefins include, but are not necessarily limited to, high density polyethylene (HDPE), low density polyethylene (LDPE), and polypropylene, including oriented polypropylene (OPP). Cyclic polyolefins include, but are not necessarily limited to, poly(bis)cyclopentadiene)). A preferred flexible plastic substrate is a cyclic polyolefin or a polyester.

Various cyclic polyolefins are suitable for the flexible plastic substrate. Examples include Arton™ made by Japan Synthetic Rubber Co., Tokyo, Japan; Zeanor™ made by Zeon Chemicals L.P., Tokyo Japan; and Topas™ made by Celanese A.G., Kronberg Germany. Arton is a poly(bis(cyclopentadiene)) condensate that is a film of a polymer and that has the formula:

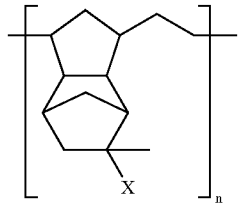

in which X is a polar group.

Alternatively, the flexible plastic substrate can be a polyester. A preferred polyester is an aromatic polyester such as Arylite.

The flexible plastic substrate can be reinforced with a hard coating. Such a hard coating typically has a thickness of from about 1 μm to about 15 μm, preferably from about 2 μm to about 4 μm, and can be provided by free radical polymerization (initiated either thermally or by ultraviolet radiation) of an appropriate polymerizable material. Depending on the substrate, different hard coatings can be used. When the substrate is polyester or Arton, a particularly preferred hard coating is the coating known as "Lintec." Lintec contains UV-cured polyester acrylate and colloidal silica; when deposited on Arton, it has a surface composition of 35 atom % C, 45 atom % O, and 20 atom % Si, excluding hydrogen. Another particularly preferred hard coating is the acrylic coating sold under the trademark "Terrapin" by Tekra Corporation, New Berlin, Wis.

Applicants have observed that the hard coating provides significant improvement in certain properties of the composite film, such as improved interlayer adhesion between the transparent conductive metallic film and the hard coating, and a reduction in roughness of the composite film. Significant effects of the hard coating may include an improvement in surface morphology (the hard coating acts as a planarizing layer, reducing roughness) and the chemical bond between the conductive metallic layer and the acrylic hard coating layer. In the event that the composite film is to be laser etched to form electrodes, the hard coating may facilitate the etching process, as discussed in commonly assigned U.S. patent application Ser. No. 10/008,808, filed Nov. 13, 2001.

C. Pre-Deposition Purging Step

A method according to the present invention can further comprise a pre-deposition purging step. This step comprises the step of purging the surface of the flexible plastic substrate with a plasma prior to film deposition. The plasma can be $Ar+O_2$, Ar, or Ar+N. Plasmas of other gases can also be used. The use of a pre-deposition plasma step can improve interlayer adhesion of a composite film according to the present invention.

D. Post-Deposition Annealing Step

A method according to the present invention can further comprise a post-deposition annealing step. Typically, the post-deposition annealing step comprises annealing the film at a temperature of between about 130° C. and about 250° C. for from about 0.5 hr to about 2 hrs. Post-deposition annealing is carried out at ambient conditions. The use of a post-deposition annealing step can improve interlayer adhesion of a composite film according to the present invention.

In contrast to the annealing process of U.S. Pat. No. 5,667,853 to Fukuyoshi, for glass based constructions, the temperature of the present annealing process is limited by the properties of the composite film. This annealing process has been found to provide significant improvements in interlayer adhesion in many cases. Certain appearance properties of the composite film, notably color and brightness, also must be considered in establishing suitable annealing conditions. These effects are further described in the Examples.

E. Desirable Properties of the Composite Film

Typically, the composite film has a transmittance of at least 80% at a visible light wavelength reference point. Preferably, the transmittance is at least about 90%.

Typically, the composite film has an electrical resistance of no greater than about 20 Ω/square. Preferably, the composite film has an electrical resistance of no greater than about 10 Ω/square. More preferably, the composite film has an electrical resistance of no greater than about 5 Ω/square.

Typically, the composite film has a root-mean-square roughness of no greater than about 5 nm. Preferably, the composite film has a root-mean-square roughness of no greater than about 2.5 nm. More preferably, the composite film has a root-mean-square roughness of no greater than about 1.3 nm.

Typically, the composite film is stable to a 500-hour exposure at 60° C. at 90% relative humidity.

Preferably, the composite film has interlayer adhesion sufficiently great to survive a 180° peel adhesion test. Further details of this test are provided in the Examples. Interlayer adhesion is a critical property during use of the composite film, in which there may be a tendency of the composite film to delaminate between the conductive metallic film and the remainder of the construction on aging, or during processing. Interlayer adhesion of a composite film according to the present invention can be improved by the use of pre-deposition plasma purging, post-deposition annealing, or the use of a hard coating in the composite film, as disclosed above.

Preferably, the composite film is wet and dry etchable; alternatively, the composite film, including a hard coating, is laser etchable. Etching is typically used for patterning TCLs for use in flat panel displays, and in other applications as well. A significant advantage of the use of the Ag/Pd/Cu alloy as the interior layer in the multi-layered metallic film is increased resistance to oxidation or corrosion following etching.

Preferably, the composite film has a brightness L of at least about 80.0%, a red to green shift a of between about 0 and about −7.00 and a blue to yellow shift b of between about 0 and about 7.00. Further details as to the measurement of the brightness, the red to green shift, and the blue to yellow shift are provided in the Example.

II. Composite Films Made by the Process of the Invention

Another aspect of the present invention is a composite film made by the process described above. Preferably, the thin-film deposition technique is DC magnetron sputtering as described above.

Preferably, the DC magnetron sputtering is performed in an atmosphere that contains argon and oxygen.

Preferably, the flexible plastic substrate is a cyclic polyolefin.

The composite film preferably has the desirable properties described above, including high transmittance, low electrical resistance, low root-mean-square roughness, stability to high temperatures at high relative humidity, and high interlayer adhesion. Preferably, the composite film is wet and dry etchable; alternatively, if a hard coating is used, preferably the film is laser etchable.

Another aspect of the present invention is a composite film comprising a three-layer metallic film as described above coated or deposited on a flexible plastic substrate, wherein the composite film: (1) has a transmittance of at least 80% in the visible region; (2) has an electrical resistance of no greater than about 20 Ω/square, preferably no greater than about 10 Ω/square, more preferably no greater than about 5 Ω/square; (3) has a root-mean-square roughness of no greater than about 5 nm, preferably no greater than about 2.5 nm, more preferably no greater than about 1.3 nm; and (4) has an interlayer adhesion between the three-layer metallic film and other elements of the composite film that is sufficiently great to survive a 180° peel adhesion test. Preferably, in this aspect of the present invention, the transmittance is at least 90% through the visible region, the electrical resistance is no greater than about 5 Ω/square, and the root-mean-square roughness is no greater than about 2.5 nm. More preferably, the composite film has a root-mean-square roughness of no greater than about 1.3 nm. In this aspect of the present invention, the composite film can further comprise a reinforcing hard coating located between the three-layer metallic film and the flexible plastic substrate. Typically, the reinforcing hard coating is an acrylic coating. Typically, the flexible plastic substrate is as described above.

III. Multilayered Electrode/Substrate Structures

Another aspect of the present invention is a multilayered electrode/substrate structure comprising a composite film according to the present invention, i.e., a composite film made according to the process described above, that has been wet etched or dry etched to form electrodes. A preferred dry etching process is disclosed in commonly assigned U.S. patent application Ser. No. 10/008,808, filed Nov. 13, 2001.

The multilayered electrode/substrate structure can be an OLED or a PLED. Preferably, the multilayered electrode/substrate structure has surface roughness of less than about 8 nm. More preferably, the multilayered electrode/substrate structure has surface roughness of less than about 5 nm. Still more preferably, the multilayered electrode/substrate structure has surface roughness of less than 2.5 nm.

Preferably, the multilayered electrode/substrate structure has a driving voltage of less than about 20 volts.

The multilayered electrode/substrate structure can include a conductive material that is a light-emitting polymer.

Typically, the light-emitting polymer is selected from the group consisting of poly p-phenylenevinylene (PPV), poly (dialkoxyphenylenevinylene), poly(thiophene), poly(fluorene), poly(phenylene), poly(phenylacetylene), poly (aniline), poly(3-alkylthiophene), poly(3-octylthiophene), and poly(N-vinylcarbazole). Preferably, the light-emitting polymer is poly(p-phenylenevinylene) (PPV) or poly(fluorene). In another alternative, the multilayered electrode/substrate structure includes a conductive material that is a luminescent organic or organometallic material.

The luminescent organic or organometallic material is typically selected from the group consisting of metal ion salts of 8-hydroxyquinolate, trivalent metal quinolate complexes, trivalent metal bridged quinolate complexes, Schiff base divalent metal complexes, tin (IV) metal complexes, metal acetylacetonate complexes, metal bidentate ligand complexes incorporating an organic ligand selected from the group consisting of 2-picolylketones, 2-quinaldylketones, and 2-(o-phenoxy) pyridine ketones, bisphosphonates, divalent metal maleonitriledithiolate complexes, molecular charge transfer complexes, rare earth mixed chelates, (5-hydroxy) quinoxaline metal complexes, and aluminum tris-quinolates.

The multilayered electrode/substrate structures can be incorporated into devices such as touch panels or flex circuits, as well as other devices that incorporate transparent conductive layers (TCL).

The invention is illustrated by the following Examples. These Examples are for illustrative purposes only and are not intended to limit the invention.

EXAMPLE 1

Roll-To-Roll Deposition and Characterization of ITO/APC/ITO Films

I. Deposition and Characterization

Substrate material was Lintec Arton coated with hard coating (HC/Arton). Table 1 lists the properties of the Lintec Arton. The hard coating on Lintec Arton has a surface composition of 35 at % C, 45 at % 0, and 20 at % Si, excluding hydrogen, and contains UV cured polyester acrylate and colloidal silica.

TABLE 1

Properties of HC/Arton sheet

| Material | GRADE | Thickness (μm) | Surface RMS (nm) | Tg (C) | Barrier (g/m²/day) (° C./RH) | Surface energy (mN/M) | T % (@ 550 nm) |
|---|---|---|---|---|---|---|---|
| HC/Arton (Lintec) | CHC-PN188W PFW | 188 | 1.3 | 171 | 31.4 (40/100) | 36.3 | 91.4 |

Deposition experiments were carried out using Avery Sputtering System with the DC magnetron sputtering mode and the roll-to-roll substrate transportation.

The base pressure of the deposition chamber was $1.5-4 \times 10^{-3}$ mT, and the working or deposition pressure was 2.4–3.1 mT. Prior to film deposition, the plastic roll was purged with Ar+O$_2$ plasma to modify the surface chemistry of plastic materials. The sputtering power of 1200 W and the gas flow-rate ratio of O$_2$/Ar of 5/50 sccm was used for the plasma purging.

An In$_2$O$_3$—10% SnO$_2$ target was sputtered with a power of 600–800 W, for the deposition of ITO films. In the depositions, the gas flow-rate ratio of O$_2$/Ar was controlled in a range of (0–3.75)/10 sccm and the line speed of the plastic roll was about 0.3–1.2 feet/min. An alloyed Ag layer was deposited by sputtering an Ag-0.5 at % Pd-1.5 at % Cu target with a power of 70–100 W. The sputtering gas was Ar at a flow rate of 10 sccm and the line speed was about 0.7–0.8 feet/min. The line speed was adjusted to control the thickness of the deposited films. The distance between the plastics and the targets was 10 inches for depositions of both ITO and AgPdCu layers.

Characterization of the ITO/APC/ITO films was correlated with the deposition processing, to reach the optimal performance of the films. The thickness and refractive index of the ITO/APC/ITO films were measured with an Ellipsometer. The chemical composition was characterized with XPS spectrum. A Digital Instruments Nanoscope III Atomic Force Microscope (AFM) and an optical microscope were used to observe and evaluate the surface morphology and roughness. The sheet resistance was measured using a 4-probe conductivity tester (Loresta). An ultraviolet/visible spectrometer (UV/VIS) and a colorimeter (Hunter) were applied to measure the visible light transmittance and to characterize the color and the brightness of the deposited films.

Interlayer adhesion of the films was evaluated using cross-scratched and 180° peel test methods with 3M tape 810. The gauge length was 1 inch and the cross-head speed was 12 in/min. Before the test, the tape was kept on the sample surface for a 20 hours dwelling time. During the test, the lamination pressure was 4 and one-half pound roller was used.

Post treatments of annealing and aging were applied on the ITO/APC/ITO films deposited on different plastics, to investigate the influences on the properties, the interfacial adhesion, and the structure stability. The annealing process was in air with a temperature of 150° C. and a time of 120 min. The aging was carried out at conditions of 60° C. and 90% relative humidity (RH) for 500 hours.

II. Thickness, Composition and Morphology

In the deposition experiments, the sputtering power used in the deposition of ITO, APC, and ITO layer were about 600, 80–100, and 600 W, respectively, except one sample whose ITO layers were formed at a power of 1000 W. The line speeds were 0.7–1.0 feet/min in the deposition of ITO films, and 0.7–0.8 feet/min in the deposition of APC layer. Both the sputtering power and the line speed were adjusted to control the thickness of both ITO and APC layers. Table 2 shows the sputtering power, O$_2$/Ar gas flow-ratio, and the thickness of all as-deposited ICO/APC/ICO films. The Ar flow rate in the deposition of APC layer was 10 sccm for the samples 173–1 to 173–7 and was 9 sccm for the rest of the samples.

TABLE 2

The deposition conditions and film thickness

| Sample IDENTIFICATION CARD | Power (W) | | | O$_2$/Ar (sccm) | Thickness (nm) | | |
|---|---|---|---|---|---|---|---|
| | ITO$_{top}$ | APC | ITO$_{bottom}$ | | Top | APC | Bott. |
| 173-1 | 650 | 90 | 650 | 1.0/10 | 46.7 | 13.6 | 43.6 |
| 173-2 | 600 | 90 | 600 | 0.6/10 | 45.4 | 12.5 | 49.6 |
| 173-3 | 1000 | 85 | 1000 | 0.6/10 | 53.2 | 13.6 | 50.3 |
| 173-4 | 600 | 80 | 600 | 1.0/10 | 39.7 | 14.3 | 38.2 |
| 173-5 | 600 | 80 | 600 | 1.0/10 | 45.5 | 14.4 | 33.0 |
| 173-6 | 600 | 80 | 600 | 1.0/10 | 45.6 | 15.0 | 59.9 |
| 173-7 | 600 | 90 | 600 | 1.0/10 | 43.7 | 15.8 | 55.4 |
| 173-8 | 600 | 90 | 600 | 0.4/10 | 44.3 | 15.7 | 42.1 |
| 173-9 | 600 | 90 | 600 | 1.0/10 | 45.9 | 19.4 | 46.8 |
| 173-10 | 600 | 90 | 600 | 1.2/10 | 41.5 | 14.6 | 49.6 |
| 173-11 | 600 | 100 | 600 | 1.2/10 | 45.7 | 15.3 | 43.1 |
| 173-12 | 600 | 100 | 600 | 3.0/8 | 42.0 | 15.5 | 38.9 |
| 173-13 | 600 | 100 | 600 | 2.0/9 | 41.7 | 15.0 | 42.5 |
| 173-14 | 600 | 100 | 600 | 3.0/8 | 42.6 | 16.2 | 32.5 |

Chemical composition of ITO/APC/ITO films was characterized using XPS techniques. The top ITO layer was first sputter-etched for 2 minutes by an Ar$^+$ beam and then the XPS spectrum was collected to calculate the film composition. In order to increase the optical transmittance of the ITO/APC/ITO films, the oxygen flow rate was increased from 0.4 to 3 sccm during the deposition of ITO layers. The obtained composition from the top ITO layer and the annealed top ITO layer is shown in Tables 3 and 4 respectively. It can be seen that the O, Sn, and In concentrations do not obviously change whether the O$_2$ flow rate is increased up to 3.0 sccm or the films were annealed at 150° C. for two hours.

TABLE 3

Surface Compositions of the Top ITO Films

| Sample ID | Sputt. Power (w) | O$_2$ flow (sccm) | Atomic % | | |
|---|---|---|---|---|---|
| | | | O | Sn | In |
| 173-7 | 600 | 1.0 | 55.7 | 3.2 | 41.1 |
| 173-11 | 600 | 1.2 | 55.9 | 3.1 | 41.0 |
| 173-13 | 600 | 2.0 | 55.4 | 3.5 | 41.0 |
| 173-12 | 600 | 3.0 | 55.7 | 3.7 | 40.6 |

TABLE 4

Surface Compositions of the Annealed Top ITO Films

| Sample ID | Sputt. Power (w) | $O_2$ flow (sccm) | Atomic % O | Sn | In |
|---|---|---|---|---|---|
| 173-7  | 600 | 1.0 | 55.1 | 3.1 | 41.8 |
| 173-11 | 600 | 1.2 | 54.9 | 3.4 | 41.6 |
| 173-13 | 600 | 2.0 | 55.2 | 3.5 | 41.3 |
| 173-12 | 600 | 3.0 | 55.4 | 3.6 | 42.0 |

The surface morphology and roughness of ITO/APC/ITO films was observed using AFM instrument on the scale of 20×20 μm. FIG. 1 shows the surface morphology of ITO/APC/ITO films synthesized at different deposition atmosphere. It can be seen that the film surfaces are very smooth and flat.

The root-mean-square (RMS) roughness, using AFM technique, is shown in Table 5. It can be seen that all ITO/APC/ITO samples are very smooth with a RMS of about 1.2 nm. It seems that the variation of $O_2$ pressure or flow rate during the deposition of ITO layers has no obvious influence on the surface morphology and roughness of the ITO/APC/ITO films, as the data shown in FIG. 1 and Table 5.

TABLE 5

Sample number, Scan Size, RMS and $R_{max}$ values.

| Sample Identification | $O_2$ flow rate (sccm) | Scan Size (um) | $R_q$ (nm) | $R_{max}$ (nm) |
|---|---|---|---|---|
| 173-7  | 1.0 | 20 × 20 | 1.22 | 20.1 |
| 173-11 | 1.2 | 20 × 20 | 1.19 | 13.4 |
| 173-13 | 2   | 20 × 20 | 1.22 | 11.6 |
| 173-12 | 3   | 20 × 20 | 1.17 | 11.0 |

III. Properties of the ITO/APC/ITO Films

In the design of Oxide/Metal/Oxide transparent and super conductive (TSC) films, the metallic (e.g. Ag or its alloy) layer works to increase the conductivity, while the top and bottom oxide films, as the protective layers, are selected with a high refractive index to increase the optical transmittance of the TSC films. To reach a sheet resistance below 5 ohm/sq, high conductive metal layer (Ag or its alloy) should have a sufficient thickness in TSC films. On the other hand, increase of the oxide layer-thickness can enhance the optical transmittance, but also affect the sheet resistance of TSC films. Usually, ITO, $SnO_2$, ICO, amorphous InTiO, etc. are good candidates for the transparent oxide films. When the ITO is used as the oxide films in TSC electrodes, the increase of the $O_2$ pressure or flow rate in the deposition is a good way to deposit colorless ITO films and thus to increase of the optical transmittance of the formed ITO/APC/ITO films.

In this project, the ITO/APC/ITO films were potentially prepared at different reactive $O_2$/Ar gas ratios and with different individual layer-thickness, to reach the optimal combination of the optical and electrical properties. All deposited samples were post-annealed at 150° C. for 2 hours, and then the as-deposited and annealed samples were all aged at 60° C. and 90% RH for 500 hours. Table 6 shows the sheet resistance, the optical transmittance at a wavelength of 550 nm, and the colors of both the as-deposited and annealed ITO/APC/ITO samples. The data are the average values measured from each sample on an area of ϕ4 inches.

TABLE 6

Properties of as-deposited and annealed ITO/APC/ITO films on HC/Arton

| Sample ID Number | As-deposited R (ohm/sq) | T (%) | Color L | a | b | Annealed R (ohm/sq) | T (%) | Color L | a | b |
|---|---|---|---|---|---|---|---|---|---|---|
| 173-1  | 5.60 | 79.88 | 62.06 | -4.01  | 18.53 | 4.68 | 80.75 | 66.17 | -5.68 | 19.01 |
| 173-2  | 6.49 | 78.72 | 62.04 | -4.29  | 9.15  | 5.90 | 79.27 | 66.98 | -6.24 | 17.06 |
| 173-3  | 6.51 | 63.72 | 58.22 | -0.66  | 21.32 | 6.57 | 69.97 | 62.57 | -3.33 | 21.01 |
| 173-4  | 6.81 | 79.02 | 67.62 | -5.16  | 13.18 | 6.51 | 84.85 | 73.65 | -7.48 | 12.14 |
| 173-5  | 6.73 | 82.09 | 69.83 | -5.17  | 4.770 | 7.06 | 85.87 | 72.57 | -5.86 | 7.780 |
| 173-6  | 6.52 | 81.05 | 68.95 | -5.89  | 14.99 | 6.94 | 86.26 | 77.44 | -6.52 | 17.62 |
| 173-7  | 6.00 | 76.92 | 65.84 | -6.56  | 5.370 | 5.41 | 81.42 | 71.21 | -6.96 | 2.740 |
| 173-8  | 5.73 | 76.18 | 65.36 | -7.07  | 9.010 | 5.97 | 81.32 | 70.61 | -5.70 | 4.740 |
| 173-9  | 4.75 | 74.47 | 64.25 | -7.39  | 3.300 | 4.26 | 78.52 | 69.50 | -8.42 | 2.050 |
| 173-10 | 4.54 | 73.41 | 64.90 | -7.87  | 8.600 | 4.38 | 81.56 | 70.80 | -8.32 | 7.020 |
| 173-11 | 3.73 | 81.15 | 64.02 | -8.92  | 9.230 | 3.53 | 81.15 | 70.93 | -9.65 | 8.250 |
| 173-12 | 3.65 | 77.84 | 68.63 | -10.45 | 8.340 | 3.10 | 84.02 | 73.32 | -8.48 | 3.700 |
| 173-13 | 3.77 | 75.24 | 68.08 | -9.92  | 10.85 | 2.98 | 80.98 | 71.67 | -9.85 | 11.75 |
| 173-14 | 3.77 | 80.95 | 71.27 | -9.38  | 6.610 | 3.04 | 83.10 | 72.88 | -9.37 | 7.440 |

Data in Table 6 show that the as-deposited ITO/APC/ITO films can reach a sheet resistance below 5 ohm/sq, as the data shown from samples 173-9 to 173-14 indicate. However, the as-deposited ITO/APC/ITO films have relatively low values in both the optical transmittance (T<85%) and brightness (L<75%). In addition, the ITO/APC/ITO films exhibit a shallow yellow-green color, as it can be deduced from the color data "a" and "b". The low transmittance and the color may due to the ITO films whose refractive index is lower than that of ICO films.

As compared with the results measured from the as-deposited films, data in Table 6 indicate that post-annealing improves the properties of the ITO/APC/ITO films. First, it can be seen that the annealing induces the obvious increases of the optical transmittance and the light brightness, averagely about 4–5%, for almost all ITO/APC/ITO samples. The maximum optical transmittance can be increased above 85% by the annealing treatment, as the data shown in Table 6. Concurrently, the sheet resistance of the ITO/APC/ITO films is decreased. The reduction on the sheet resistance is more obvious for the samples 173, 9–14, as the sheet resistance of these samples is reduced from 3.65–4.75 ohm/sq, for the as-deposited status, to 2.98–4.26 ohm/sq, for the annealed films. As associated with the data shown in Table 2, it can be seen that ITO/APC/ITO films deposited at high $O_2$ flow rate exhibit the obvious changes in increasing optical transmittance and decreasing sheet resistance. However, annealing seems to have no obvious effect on the color change as the ITO/APC/ITO films after annealing still have the color data which are the same with or even higher than those of the as-deposited samples, as one can see the data in Table 6.

Figure 2:
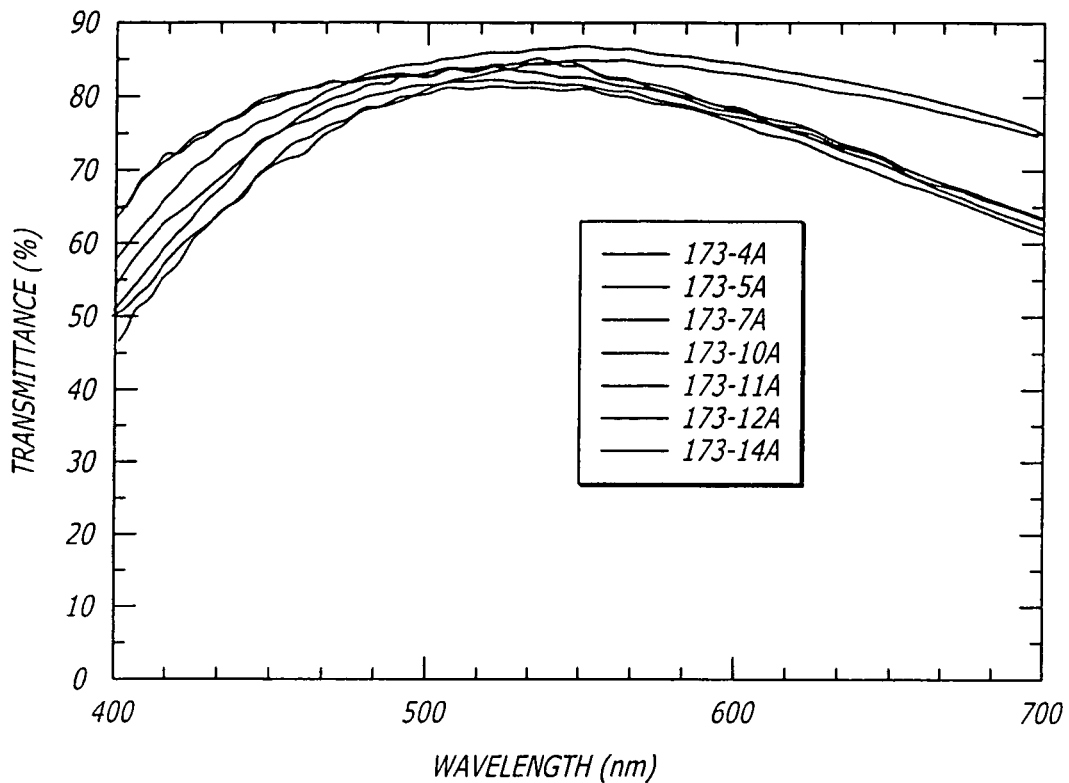
FIG. 2 is a graph showing the optical transmittance of ITO/AgPdCu/ITO films of Example 1 deposited on HC/Arton.

FIG. 2 show the optical transmittance of some annealed ITO/APC/ITO films listed in Table 6. The optical transmittance of these samples at a wavelength of 550 nm is, at least, above 80%, which is consistent with the results reported by Polaroid Corporation, USA (International Patent WO99/36261).

Table 7 shows the sheet resistance, transmittance, and color data measured from all aged samples that are the as-deposited and annealed ITO/APC/ITO films. Compared with the data in Tables 6 and 7 for both the as-deposited and the annealed samples, it can be seen that the sheet resistance for the aged samples is very close to that for the samples without aging. This means that aging does not induce the obvious changes in sheet resistance of the ITO/APC/ITO films. However, aging process induces the obvious increase of the optical transmittance, especially for some as-deposited samples (e.g. 173–12 and 173–14), the optical transmittance is increased by 7–10%. In addition, the aging process slightly increases the brightness and obviously reduces the color, as the value of "L" is increased and those of both "a" and "b" are decreased in Table 7. With regarding to the influence of the aging treatment, data in Tables 6 and 7 show that the annealed samples always have the better properties than the as-deposited samples, which suggests the importance of the post-annealing on improvement of the properties of ITO/APC/ITO films. Although the influence mechanism of both annealing and aging on the properties of ITO/APC/ITO films is not described here, the oxidation atmospheres in both aging and annealing process may imply the role of the oxygen concentration on the formation of ITO/APC/ITO films with good properties.

TABLE 7

Properties of as-deposited and annealed ITO/APC/ITO films on HC/Arton

| Sample | As-deposited | | | | | Annealed | | | | |
|---|---|---|---|---|---|---|---|---|---|---|
| ID | R | T | Color | | | R | T | Color | | |
| Number | (ohm/sq) | (%) | L | a | b | (ohm/sq) | (%) | L | a | b |
| 173-1 | 5.27 | 79.95 | 67.15 | −6.62 | 15.04 | 5.19 | 87.45 | 72.23 | −5.88 | 8.500 |
| 173-2 | 6.41 | 78.46 | 64.74 | −4.99 | 16.79 | 6.33 | 81.96 | 67.93 | −5.81 | 12.02 |
| 173-3 | 7.14 | 71.43 | 61.13 | −3.37 | 23.41 | 6.57 | 73.00 | 63.90 | −4.04 | 20.72 |
| 173-4 | 7.00 | 83.96 | 69.10 | −5.46 | 6.840 | 6.73 | 86.78 | 72.09 | −6.55 | 6.930 |
| 173-5 | 6.73 | 82.24 | 67.92 | −4.01 | 4.260 | 6.65 | 87.30 | 72.98 | −4.06 | 3.780 |
| 173-6 | 6.82 | 83.43 | 68.87 | −3.16 | 4.800 | 6.69 | 89.70 | 75.62 | −5.98 | 10.01 |
| 173-7 | 6.08 | 79.73 | 67.23 | −5.06 | 5.940 | 5.60 | 83.20 | 68.63 | −5.11 | 1.230 |
| 173-8 | 5.92 | 79.70 | 65.94 | −4.90 | 5.260 | 5.51 | 83.80 | 69.50 | −5.55 | 2.380 |
| 173-9 | 4.95 | 78.13 | 65.23 | −5.85 | 1.470 | 4.21 | 82.89 | 68.64 | −6.10 | −0.90 |
| 173-10 | 4.87 | 82.98 | 68.46 | −5.65 | 2.630 | 3.97 | 84.59 | 70.65 | −7.18 | 2.590 |
| 173-11 | 3.57 | 80.27 | 68.86 | −5.40 | 2.200 | 3.24 | 84.06 | 70.93 | −8.63 | 3.030 |
| 173-12 | 3.40 | 87.15 | 72.33 | −7.06 | −0.180 | 2.92 | 86.59 | 71.91 | −8.16 | 1.060 |
| 173-13 | 3.89 | 87.49 | 72.48 | −7.59 | 3.210 | 3.32 | 84.15 | 73.08 | −7.54 | 3.720 |
| 173-14 | 3.24 | 87.89 | 73.50 | −7.24 | 0.410 | 2.75 | 84.74 | 72.01 | −8.54 | 3.270 |

Associating the layer thickness and $O_2$/Ar gas ratio (Table 2) with the properties (Tables 6 and 7), it can be found that the formation of ITO/APC/ITO films with low sheet resistance and high optical transmittance is highly dependent on the deposition conditions. Table 8 shows the influence of the layer thickness of top ITO film on the sheet resistance and the transmittance of annealed ITO/APC/ITO films. The selected samples are prepared at an $O_2$/Ar gas ratio of 0.6–1.2. The sputtering power for APC layer is 80–100 W and for ITO layer is 600 W, except sample 173–3 whose ITO is deposited at a power of 1000 W. It can be seen that while APC layer is about 13.6–15.8 nm thick, the increase of top ITO thickness from 39.7 to 53.2 nm has no consistent influence on the sheet resistance and the transmittance of the formed ITO/APC/ITO films. As the variation of top ITO thickness is just about ±7 nm in these samples, it can not have an obvious influence on the properties as compared with other deposition conditions.

TABLE 8

Thickness of ITO and APC layers and deposition parameters (annealed)

| Sample IDENTIFICATION CARD | 173-4 | 173-10 | 173-7 | 173-5 | 173-6 | 173-11 | 173-1 | 173-3 |
|---|---|---|---|---|---|---|---|---|
| Top ITO (nm) | 39.7 | 41.5 | 43.7 | 45.5 | 45.6 | 45.7 | 46.7 | 53.2 |
| APC layer (nm) | 14.3 | 14.6 | 15.8 | 14.4 | 15.0 | 15.3 | 13.6 | 13.6 |
| R (ohm/sq) | 6.51 | 4.38 | 5.41 | 7.06 | 6.94 | 3.53 | 4.68 | 6.57 |
| T (%) | 84.85 | 81.56 | 81.42 | 85.87 | 86.26 | 81.15 | 80.75 | 69.97 |
| $O_2$/ar for ITO (sccm) | 1.0 | 1.2 | 0.6 | 1.0 | 1.0 | 1.2 | 1.0 | 0.6 |
| Power for APC (W) | 80 | 90 | 85 | 80 | 80 | 100 | 90 | 85 |

Figure 3:
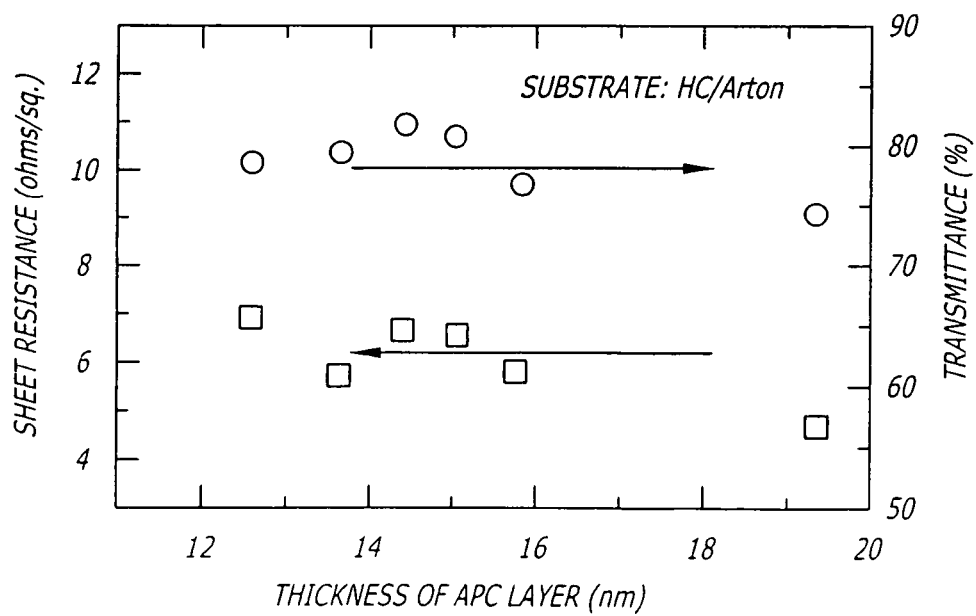
FIG. 3 is a graph showing the thickness of the AgPdCu layer versus transmittance and sheet resistance for ITO/AgPdCu/ITO films of Example 1 as deposited.

Variation of APC layer-thickness has more series influence on the properties of the ITO/APC/ITO films, as compared with the influence of ITO layers. FIG. 3 shows the sheet resistance and the optical transmittance of the as-deposited ITO/APC/ITO films formed with different APC thickness. The thickness of ITO layer of these samples and other deposition conditions are shown in Table 9.

TABLE 9

Preparation and characterization of ITO/APC/ITO films

| Sample ID | 173.2 | 173-1 | 173.5 | 173.6 | 173.7 | 173.9 |
|---|---|---|---|---|---|---|
| Top ITO (nm) | 45.4 | 46.7 | 45.5 | 45.6 | 43.7 | 45.9 |
| APC (nm) | 12.5 | 13.6 | 14.4 | 15.0 | 15.8 | 19.4 |

TABLE 9-continued

Preparation and characterization of ITO/APC/ITO films

| Sample ID | 173.2 | 173-1 | 173.5 | 173.6 | 173.7 | 173.9 |
|---|---|---|---|---|---|---|
| R (ohm/sq) | 6.49 | 5.60 | 6.73 | 6.52 | 6.00 | 4.75 |
| T (%) | 78.72 | 79.88 | 82.09 | 81.05 | 76.92 | 74.47 |
| $O_2$/Ar for ITO (sccm) | 0.6 | 1.0 | 1.0 | 1.0 | 0.6 | 1.0 |
| Power for APC (W) | 90 | 90 | 80 | 80 | 85 | 90 |

Data in FIG. 3 and Table 9 show that when the ITO layer is about 45 nm thick, the increase of APC thickness from 12.5 to 19.4 nm results in reductions of the sheet resistance and the transmittance from 6.73 to 4.75 ohm/sq, and from 82.09 to 74.47%, respectively. The similar changing trends are also found from the annealed and aged ITO/APC/ITO samples. Further analyzing the data in Tables 2, 6 and 7, it can be found that a PAC layer with a thickness about 15 nm and a ITO layer thinner than 44 nm are necessary conditions for the ITO/APC/ITO films to have a sheet resistance below 5 ohm/sq. This is identified by the data measured from the samples of 173-9 through 173-14, as one can see them in Tables 6, 7 and 9.

Figure 4:
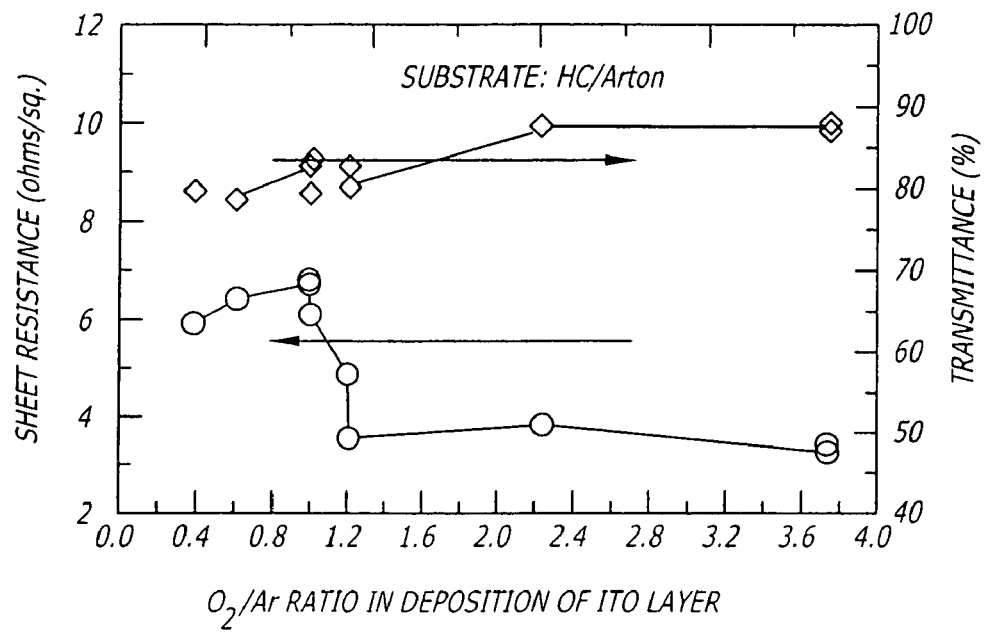
FIG. 4 is a graph showing the $O_2$/Ar ratio versus the sheet resistance and optical transmittance for ITO/AgPdCu/ITO films of Example 1 after aging.

However, the most important factor to affect the properties of ITO/APC/ITO films is the $O_2$/Ar gas ratio used in the deposition of ITO layers. FIG. 4 shows the influence of the $O_2$/Ar gas ratio on the sheet resistance and the optical transmittance of aged ITO/APC/ITO films. The data in FIG. 4 are also listed in Table 10 with the corresponding deposition conditions. In order to improve the optical transmittance of the ITO/APC/ITO films, the $O_2$/Ar gas ratio was increased to 3.75/10 (corresponding to actual $O_2$/Ar gas ratio of 3/9 sccm) in this project.

TABLE 10

Preparation and characterization of ITO/APC/ITO films

| Sample ID | 173-8 | 173-2 | 173-5 | 173-6 | 173-7 | 173-10 | 173-11 | 173-13 | 173-12 | 173-14 |
|---|---|---|---|---|---|---|---|---|---|---|
| Top ITO (nm) | 44.3 | 45.4 | 45.5 | 45.6 | 43.7 | 41.5 | 45.7 | 41.7 | 42.0 | 42.6 |
| APC (nm) | 15.7 | 12.5 | 14.4 | 15.0 | 15.8 | 14.6 | 15.3 | 15.0 | 15.5 | 16.2 |
| R (ohm/sq) | 5.92 | 6.41 | 6.73 | 6.82 | 6.08 | 4.87 | 3.57 | 3.89 | 3.40 | 3.24 |
| T (%) | 79.70 | 78.46 | 82.84 | 83.43 | 79.73 | 82.98 | 80.27 | 87.49 | 87.15 | 87.89 |
| $O_2$/Ar for ITO (sccm) | 0.4 | 0.6 | 1.0 | 1.0 | 1.0 | 1.2 | 1.2 | 2.22 | 3.75 | 3.75 |
| Power for APC (W) | 90 | 90 | 80 | 80 | 85 | 90 | 100 | 100 | 100 | 100 |

Figure 5:
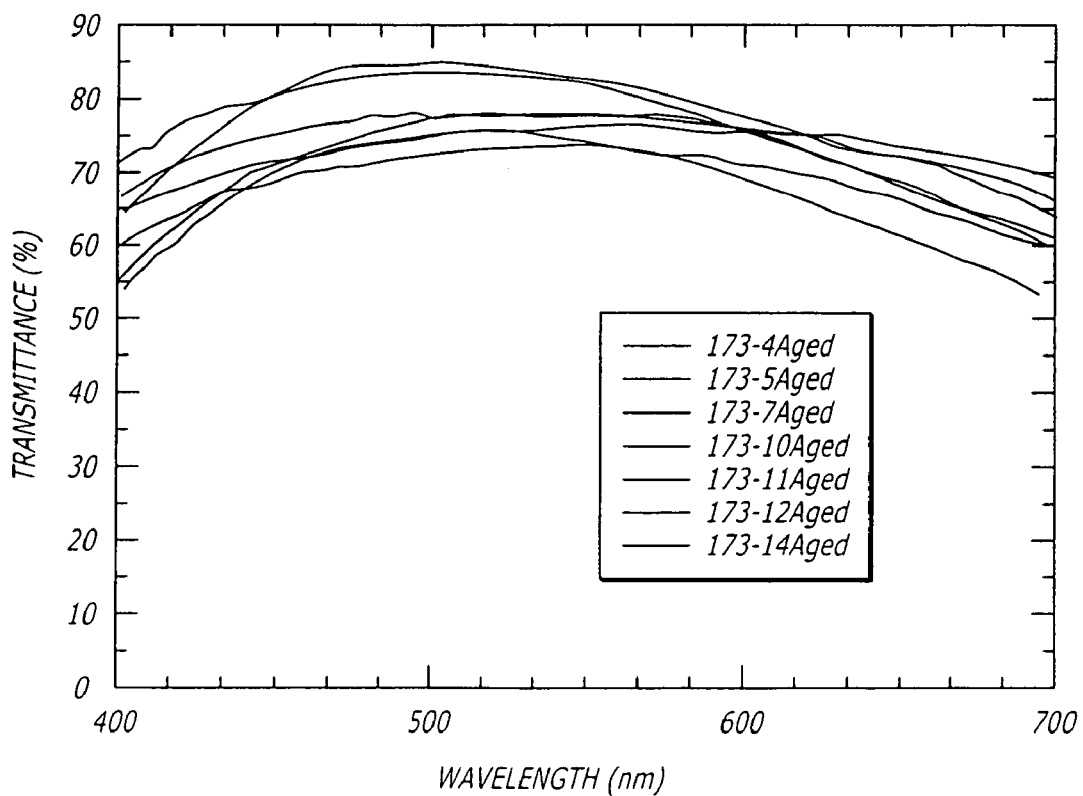
FIG. 5 is a graph showing the transmittance of aged ITO/AgPdCu/ITO films prepared at different $O_2$/Ar ratios.

FIG. 5 shows the transmittance curves of some aged ITO/APC/ITO films. Samples 173-12 to 173-14, prepared at the $O_2$/Ar gas ratios of 2.22–3.75, exhibit higher transmittance than that of other samples.

IV. Interlayer Adhesion and Structure Stability

The interlayer adhesion tests (IATs) were performed to evaluate the interlayer adhesion of all as-deposited, annealed, and aged ITO/APC/ITO films. In addition, all samples were also cross-hatched and then performed IATs to evaluate the interlayer adhesion under situations where the film has the existed cracks, flakes, and the etched grooves. The cross-hatched peel test is specially suitable to evaluate the interlayer adhesion of the films whose surface was not damaged by the normal IAT process. After the IATs, the surface morphology of the ITO/APC/ITO films was observed under an optical microscope.

The averaged peel forces were measured from as-deposited, annealed, and aged ITO/APC/ITO films in the IATs. It was found that all as-deposited ITO/APC/ITO films had the maximum peel force around an average value of about 760 g. After annealing, the peel force of all ITO/APC/ITO films was decreased to an average value of about 600 g. However, the average peel force was further decreased when both the as-deposited and annealed ITO/APC/ITO samples were aged at 60° C. and 90% RH for 500 hours. The peel force of the as-deposited samples after aging was reduced to an average value of about 600 g while that of the annealed sample after aging was further down to that of 480–580 g. The reduction of the peel force is proportional to the time of the post-treating (annealing+aging), which suggests the reduction of the surface energy of the ITO/APC/ITO films when they are exposed to oxygen atmosphere.

The surfaces of the ITO/APC/ITO films after IATs and cross-hatched IATs are observed, as any damage formed on the film surface suggests the failure of the film to pass the IAT. It was found that all as-deposited and annealed samples smoothly passed the IAT without any damage or defect formed on the film surface. For the aging treatment, it was found that the aging induced formation of the corrosive pits and flakes on the surfaces of some as-deposited samples. The corrosive pits and flakes may result from the poor interlayer adhesion or structure stability. Another possible reason is the fine water drops that existed in the aging atmosphere and dropped on the film surface during aging. However, these defects were not found on the surface of the annealed samples after aging treatment. Which suggested that the post-annealing enhanced the interlayer adhesion and structure stability of the ITO/APC/ITO films.

Figure 6A:
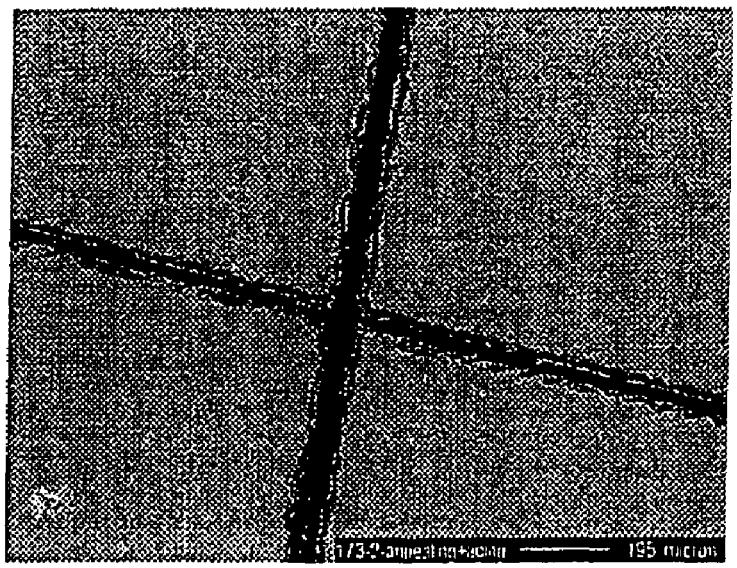
FIG. 6(a) (b) shows surface morphologies of ITO/APC/ITO films
Figure 6B:
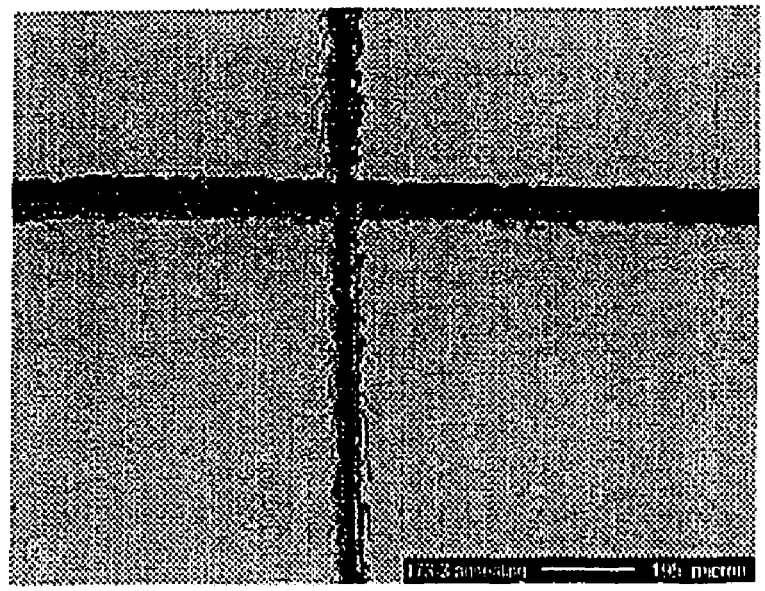
Figure 7A:
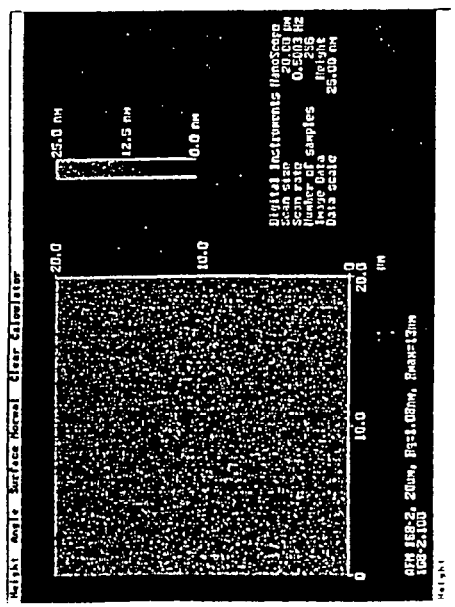
FIG. 7 is a diagram showing the results in two dimensions (a) and three dimensions (b) of a determination of surface morphology and roughness for an InCeO/AgPdCu/InCeO film of Example 2 determined by an Atomic Force Microscope (scan size 20×20 μM).
Figure 7B:
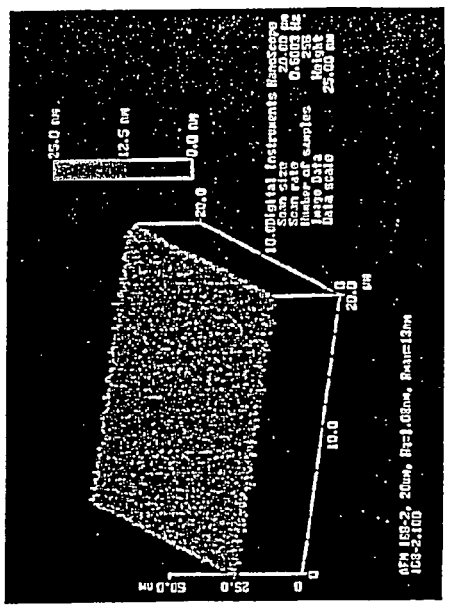

According to ASTM 3359B standard, the sample passes the IAT if the cracks and flakes induced by the IAT are less than 5% of the treated surface area. FIGS. 6(a) and (b) show typical surface morphologies of the cross-hatched ITO/APC/ITO films after IAT process. For the cross-hatched films, IAT results indicated that all as-deposited samples, most annealed samples, and all as-deposited and annealed samples after aging treatment passed the IAT process. The tested samples have no any observable crack and flank produced along the cut line or groove edges after IAT process, as a typical picture shown in FIG. 6(a). It was only observed that annealed samples 173-3, 173-8, 173-10, and 173-13 contained some small cracks and flakes that were 5–10% of the area of IATs, as a typical picture shown in FIG. 6(b).

The interlayer adhesion investigation indicated that most ITO/APC/ITO films can pass the IATs with tape 810. The ITO/APC/ITO films prepared with a high $O_2$/Ar gas ratio still have the good interlayer adhesion. The annealing seems helpful to enhance the interlayer adhesion and structure stability of the films. However, it has also been found from IAT process that the ITO/APC/ITO films are harder and more brittle than InCeO/Ag/InCeO (or ICO/MC/ICO) and InCeO/AgPdCu/InCeO (or ICO/APC/ICO) films, as the cracks are formed on the film surface during cross-hatched IAT process.

Table 11 shows the surface information observed by bare eyes over an area of 4 squire inches of the aged ITO/APC/ITO films. The most ITO/APC/ITO films had no any defect on the surface when they were aged at 60° C. and 90% RH for 500 hours. It was found that the water drops were spun on the sample surface during aging and resulted in the formation of oxidized stains there. In addition, although there is no defect formed on some as-deposited ITO/APC/ITO films, it should be mentioned that the observation with microscope indicated that these samples contained some corrosive spots on the film surface. Combined the surface observation and the IATs, it has been confirmed that the annealed and aged samples have the better structure stability.

TABLE 11

Surface situation of aged ITO/APC/ITO films

| Sample ID | As-deposited | Annealed |
|---|---|---|
| 173-1 | One stain | One stain from water drop |
| 173-2 | Few fine stains in cutting edge | Few fine stains in cutting edge |
| 173-3 | No defect | One stain from water drop, scratches |
| 173-4 | No defect | No defect |
| 173-5 | No defect | No defect |
| 173-6 | No defect | Few fine stains |
| 173-7 | No defect | No defect |
| 173-8 | No defect | No defect |
| 173-9 | Fine pits, delaminated film | Fine pits, delaminated film |
| 173-10 | No defect | No defect |
| 173-11 | No defect | No defect |
| 173-12 | One big stain from water drop | Few fine stains |
| 173-13 | No defect | No defect |
| 173-14 | No defect | No defect |

V. Conclusion

The ITO/APC/ITO films can be roll-to-roll deposited on HC/Arton with the sheet resistance below 5 ohm/sq, the transmittance above 80%, and the smooth and flat surface. In order to increase the optical transmittance of ITO/APC/ITO films, the $O_2$/Ar flow ratio in deposition of the ITO layers should be maintained above 1.2 sccm. The ITO/APC/ITO films prepared at high $O_2$/Ar gas ratio of 2.22–3.75 can reach a sheet resistance down to 3–4 ohm/sq and an optical transmittance above 85% if the films have the thickness of about 15 nm for APC layer and below 44 nm for ITO layers.

Post-annealing can improve the properties of ITO/APC/ITO films by decreasing the sheet resistance and increase of the transmittance. IATs indicated that post-annealed ITO/APC/ITO films have the better interlayer adhesion and structure stability even the ITO/APC/ITO films aged at 60° C. and 90% RH for 500 hours.

It has been found that high $O_2$/Ar gas ratio is helpful to deposit ITO/APC/ITO films with low sheet resistance and improved optical properties, such as the increase of the transmittance and reduction of the color. In addition, ITO/APC/ITO films prepared with high $O_2$/Ar gas ratio still have the good interlayer adhesion and structure stability. The ITO/APC/ITO films can reach the same conductive level with the ICO/AAC/ICO and the ICO/APC/ICO films.

EXAMPLE 2

Roll-To-Roll Deposition and Characterization of ICO/APC/ICO Films

I. Deposition and Characterization

Substrate material was the Lintec Arton coated with hard coating (HC/Arton). The hard coating has a surface composition of 35 at % C, 45 at % 0, and 20 at % Si, excluding hydrogen, and contains uv cured polyester acrylate and colloidal silica. The properties of HC/Arton are listed in Table 1, above, in Example 1.

Deposition experiment was carried out using Avery Sputtering System with the DC magnetron sputtering mode and the roll-to-roll substrate transportation.

The base pressure of the deposition chamber was 1.5–4× $10^{-3}$ mT, and the working or deposition pressure was 2.4–3.1 mT. Prior to film deposition, the plastic roll was purged with Ar+$O_2$ plasma to modify the surface chemistry of plastic materials. The sputtering power of 1200 W and the gas flow-rate ratio of $O_2$/Ar of 5/50 sccm were used for the plasma purging.

An $In_2O_3$—10% $CeO_2$ target was sputtered with a power of 600–800 W, for the deposition of InCeO films. In the depositions, the gas flow-rate ratio of $O_2$/Ar was controlled in a range of (0–2)/10 sccm and the line speed of the plastic roll was about 0.3–1.2 feet/min. An alloyed Ag layer was deposited by sputtering an Ag-0.5 at % Pd-1.5 at % Cu target with a power of 70–90 W. The sputtering gas was Ar at a flow rate of 10 sccm and the line speed was about 0.7–0.8 feet/min. The line speed was adjusted to control the thickness of the deposited films. The distance between the plastics and the targets was 10 inches for depositions of both InCeO and AgPdCu layers.

The technical methods and instruments used to measure and evaluate the thickness, surface morphologies and roughness, electrical and optical properties, and interfacial adhesion of the ICO/APC/ICO films are the same with those used in the characterization of ITO/APC/ITO films, as described in Example 1. The processing conditions for post annealing and aging of ITO/APC/ITO films are also identical to those used in Example 1.

II. Composition and Morphology

Chemical composition of ICO/APC/ICO films was characterized using XPS techniques. The top ICO layer was first sputter-etched for 1.5 minutes by an $Ar^+$ beam and then the XPS spectrum was collected to calculate the film composition. The obtained composition from top ICO layers is shown in Table 12. It can be seen that the O, Sn, and In concentrations do not obviously change although the $O_2$ flow rate is increased from 0.6 to 2.0 sccm in the depositions. However, it seems that Ce concentration is slightly decreased with the increase of the $O_2$ flow rate.

TABLE 12

Surface Compositions of the Sputtered InCeO Films

| Sample IDENTIFICATION CARD | $O_2$ flow (sccm) | Atomic % | | | |
|---|---|---|---|---|---|
| | | O | Sn | In | Ce |
| 168-1 | 0.6 | 54.1 | 0.8 | 38.2 | 6.9 |
| 168-2 | 1.0 | 53.6 | 0.9 | 38.8 | 6.7 |
| 168-3 | 1.5 | 53.7 | 0.9 | 39.1 | 6.3 |
| 168-4 | 2.0 | 54.2 | 0.8 | 38.7 | 6.3 |

Table 13 shows the depth profiles measured from sample 168-4. As the concentrations of Pd and Cu in the APC target are only about 0.5 and 1.5 at. %, the XPS spectra could not detect the signals of these elements from the deposited APC layer, so no data from these elements are shown in Table 13.

TABLE 13

Depth Profile of Sample 168-4

| Sputtering time (min) | Composition (at. %) | | | | | | |
|---|---|---|---|---|---|---|---|
| | C | O | Si | Sn | In | Ce | Ag |
| 0 | 4.7 | 52.5 | — | 0.9 | 36.7 | 5.3 | — |
| 10 | — | 53.5 | — | 0.9 | 37.6 | 8.0 | — |
| 20 | — | 54.4 | — | 0.8 | 37.1 | 7.5 | — |
| 30 | — | 54.3 | — | 0.9 | 37.0 | 7.7 | — |
| 40 | — | 26.0 | — | 0.8 | 15.1 | 8.6 | 49.5 |
| 50 | — | 50.0 | — | 0.8 | 35.1 | 6.1 | 8.0 |
| 60 | — | 53.8 | — | 0.8 | 37.3 | 7.2 | 0.8 |
| 63 | — | 54.4 | — | 0.8 | 36.6 | 7.6 | 0.6 |
| 66 | — | 53.7 | — | 0.8 | 37.5 | 7.6 | 0.4 |
| 69 | — | 53.7 | — | 0.7 | 37.3 | 7.9 | 0.4 |
| 72 | — | 53.9 | — | 0.7 | 37.5 | 7.5 | 0.3 |
| 82 | — | 55.2 | — | 0.9 | 35.7 | 8.2 | 0.1 |
| 92 | — | 56.6 | 1.0 | 0.8 | 33.3 | 8.3 | 0.1 |
| 102 | 0.8 | 62.4 | 22.0 | 0.2 | 10.0 | 4.5 | — |
| 105 | 2.1 | 62.6 | 24.9 | 0.1 | 6.6 | 3.7 | — |
| 108 | 3.3 | 61.4 | 27.0 | 0.1 | 5.1 | 3.0 | — |
| 111 | 3.8 | 60.9 | 28.7 | — | 3.6 | 3.0 | — |
| 114 | 5.9 | 65.4 | 23.1 | — | 2.7 | 3.0 | — |
| 117 | 6.2 | 58.3 | 31.2 | — | 1.7 | 2.5 | — |
| 120 | 8.2 | 56.7 | 31.5 | — | 1.3 | 2.3 | — |

* The sputtering rate is rough

Figure 8:
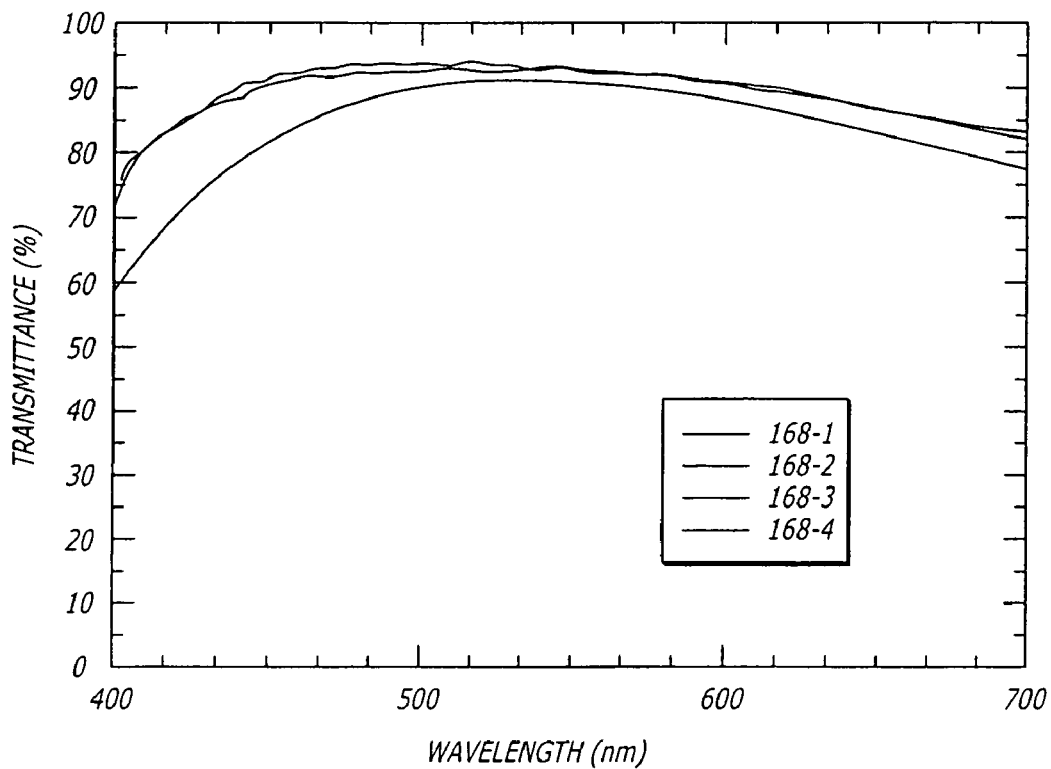
FIG. 8 is a graph showing the optical transmittance of InCeO/AgPdCu/InCeO films of Example 2 deposited on HC/Arton.

The surface morphology and roughness was observed and evaluated as the surface situation sensitively affects the electrical and optical properties of the formed films. The surface morphology and roughness of ICO/APC/ICO films were characterized by AFM on the scales of 20×20 μm, 5×5 μm and 1×1 μm, respectively. FIG. 8 shows a typical surface morphology of ICO/APC/ICO films, which is very smooth and flat.

The measured root-mean-square (RMS) roughness is listed in Table 14. It can be seen that all samples appear very smooth with a RMS below 2 nm. Decreasing $O_2$ gas pressure or flow rate seems to induce formation of the films with an improved surface smoothness as sample 168–1 and 168–2 are smoother with a RMS around 1 nm. The RMS measured under different scales is very close in values, as one can see from the data in Table 14.

TABLE 14

Sample number, Scan Size, RMS and $R_{max}$ values.

| Sample Identification | Scan Size (um) | RMS (nm) | $R_{max}$ (nm) |
|---|---|---|---|
| AFM 168-1 | 20 × 20 | 0.94 | 10 |
| $O_2$ = 0.6 | 5 × 5 | 1.02 | 8.98 |
| sccm | 1 = 1 | 1.13 | 9.49 |
| AFM 168-2 | 20 × 20 | 1.08 | 13 |
| $O_2$ = 1.0 | 5 × 5 | 1.33 | 14 |
| sccm | 1 × 1 | 1.14 | 9.32 |
| AFM 168-3 | 20 × 20 | 1.41 | 18 |
| $O_2$ = 1.5 | 5 × 5 | 1.79 | 13 |
| sccm | 1 × 1 | 1.24 | 11 |
| AFM 168-4 | 20 × 20 | 1.27 | 14 |
| $O_2$ = 2.0 | 5 × 5 | 1.29 | 11 |
| sccm | 1 × 1 | 1.38 | 10.5 |

III. Properties of the ICO/APC/ICO Films

The $O_2$ flow-rate or pressure as the deposition factor can sensitively influence the optical transmittance and conductivity of the formed oxide films. As a result, variation of the $O_2$ flow rate affects the 0 concentration in the deposited InCeO layer and then the properties of the ICO/APC/ICO films. In the deposition experiments, ICO/APC/ICO films were deposited on HC/Arton during which ICO layers were synthesized with a $O_2$:Ar gas ratio of 0.6:10, 1.0:10; 1.5:10, and 2.0:10 sccm, respectively. The Ar flow rate of 10 sccm and the deposition distance of 10 inches were kept constant in the deposition of both ICO and APC layers. Other deposition conditions, such as the sputter powers of 600, 75, and 600 W, and the line speeds of 0.7, 0.8, and 0.7 feet/min are used to deposit the bottom ICO, APC, and top ICO layers respectively.

Figure 13A:
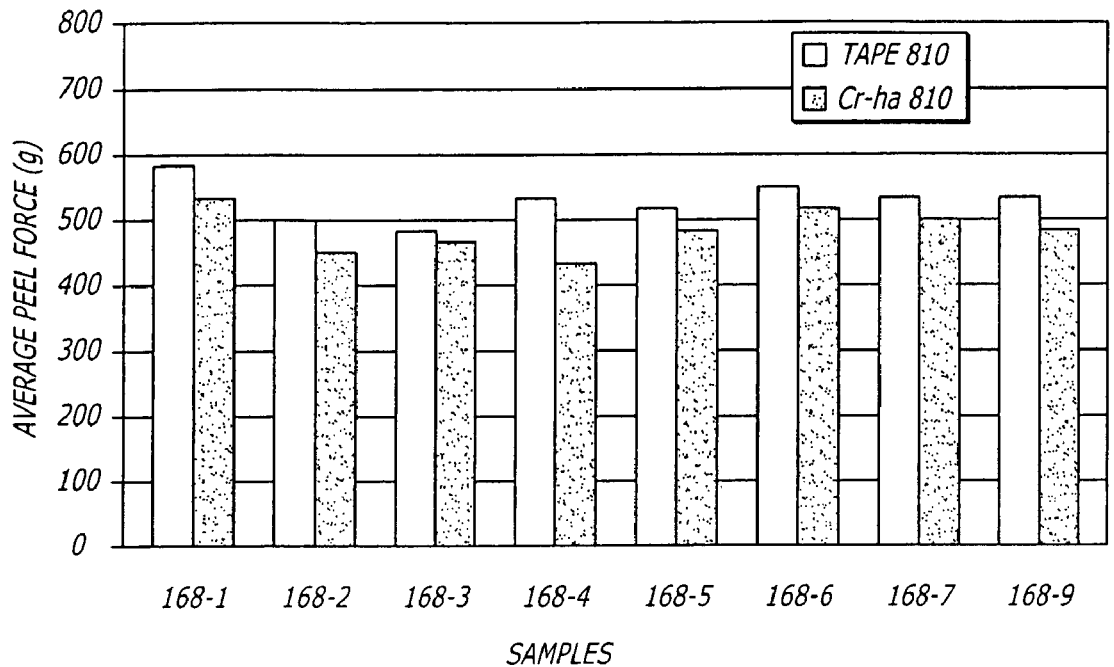
FIG. 13 is a graph showing the averaged forces for the results of 180° peel tests with Tape 810: (a) aged samples; (b) annealed and aged samples.
Figure 13B:
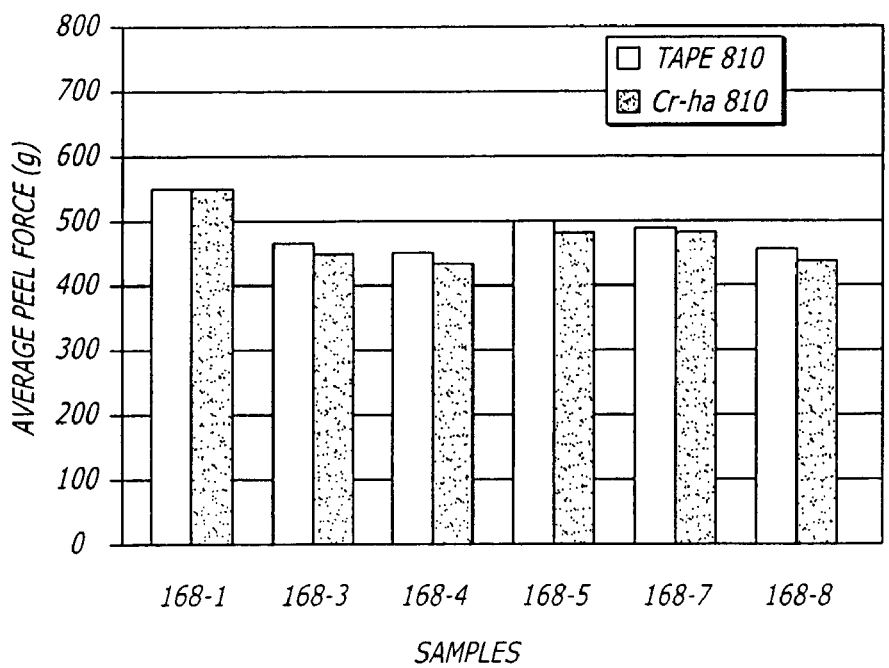

Table 15 shows the interrelationship between the $O_2$ flow rate, the thickness, the properties, and the interlayer adhesion of the as-deposited ICO/APC/ICO films. The transmittance, color, and sheet resistance are the average values measured from an area of φ2 inches. In addition, the transmittance curves of the ICO/APC/ICO films in Table 15 are measured as shown in FIG. 13.

sheet resistance of around 6 ohm/sq, as the data shown in Table 15 and in FIG. 8. In addition, all samples passed the interlayer adhesion tests (IATs) using tape 810. For the detailed analysis, it can be found that the increase of $O_2$ gas-flow rate from 0.6 to 2 sccm results in the decrease of the thickness of both ICO and APC layers in the ICO/APC/ICO structure, as the data shown in Table 15. As a result, the transmittance is increased but the sheet resistance is not obviously changed. As compared with InCeO/AgAuCu/InCeO (ICO/AAC/ICO) films, ICO/APC/ICO films seem to have a relatively heavy color, as the brightness is below 80% (see data in Table 15).

Figure 9:
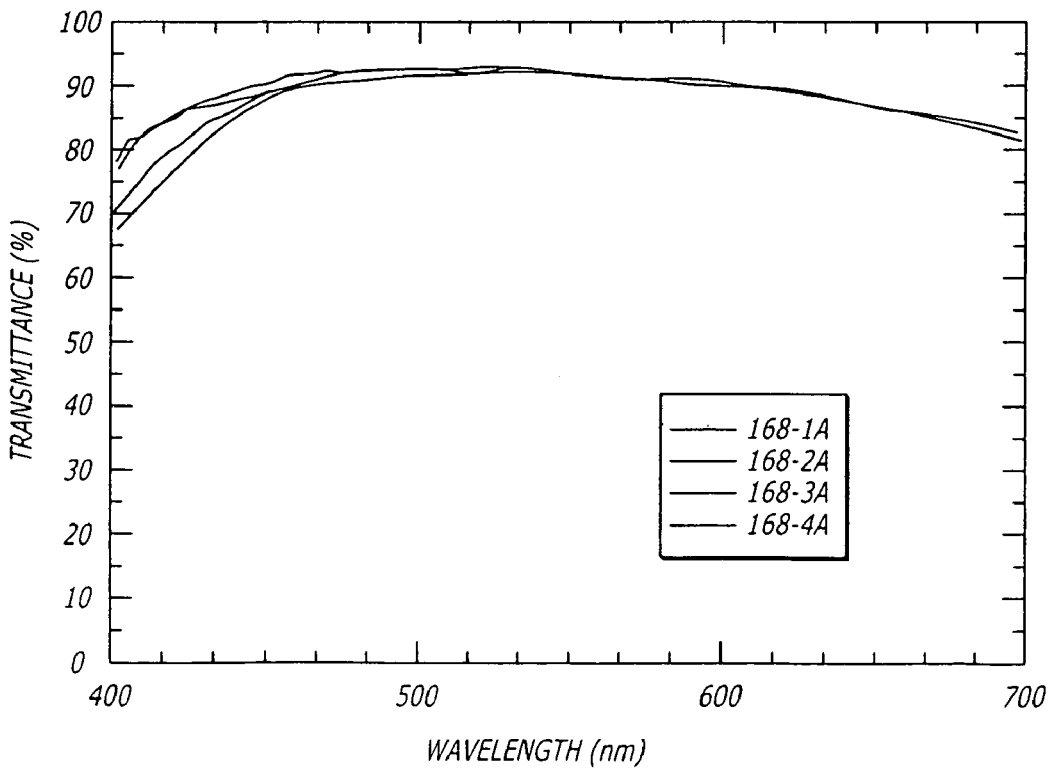
FIG. 9 is a graph showing the optical transmittance of annealed InCeO/AgPdCu/InCeO films of Example 2 deposited on HC/Arton.

Table 16 shows the properties measured from the ICO/APC/ICO films annealed at 145° C. for two hours. FIG. 9 show the optical transmittance measured from corresponding annealed ICO/APC/ICO films deposited on HC/Arton. As compared with the as-deposited films (see Table 15), annealing induces the reduction of the sheet resistance from 5.84–6.57 ohm/sq to 5.09–5.73 ohm/sq, reduced by 20%, and the rise of the brightness from (75.2–76.3) % to (76.1–77.7) %, increased up to 2%. The optical transmittance is also slightly increased after the annealing. In addition, Table 17 shows that all ICO/APC/ICO samples deposited at different $O_2$ flow rates pass the IATs.

TABLE 15

Properties of ICO/APC/ICO films on HC/Arton
ICO (top) - APC - ICO (bottom)

| Sample IDENTIFICATION CARD | $O_2$ (sccm) | Thickness (nm) | IAT (tape 810) | Color | T % @ 550 nm | Rs (Ω/sq) |
|---|---|---|---|---|---|---|
| 168-1 | 0.6 – 0 – 0.6 | 43.4 – 15.5 – 42.5 | Pass | 76.3 –5.19 0.13 | 90.9 | 6.33 |
| 168-2 | 1.0 – 0 – 1.0 | 40.6 – 13.6 – 44.1 | Pass | 76.3 –2.95 1.35 | 92.8 | 5.84 |
| 168-3 | 1.5 – 0 – 1.5 | 40.3 – 13.1 – 40.6 | Pass | 75.2 –3.07 1.69 | 92.4 | 6.04 |
| 168-4 | 2.0 – 0 – 2.0 | 39.9 – 12.9 – 39.7 | Pass | 75.4 –3.07 2.27 | 92.2 | 6.57 |

It is confirmed that that the ICO/APC/ICO films can be prepared with a high transmittance above 90% and a low

TABLE 16

Properties of annealed ICO/APC/ICO films on HC/Arton
ICO (top) - APC - ICO (bottom)

| Sample IDENTIFICATION CARD | $O_2$ (sccm) | Thickness (nm) | IAT (tape 810) | Color | | | T % at 550 nm | Rs (Ω/sq) |
|---|---|---|---|---|---|---|---|---|
| | | | | L | a | b | | |
| 168-1 | 0.6 – 0 – 0.6 | 43.4 – 15.5 – 42.5 | Pass | 77.6 | –4.22 | 2.60 | 92.67 | 5.73 |
| 168-2 | 1.0 – 0 – 1.0 | 40.6 – 13.6 – 44.1 | Pass | 77.7 | –3.30 | 3.51 | 92.16 | 5.58 |
| 168-3 | 1.5 – 0 – 1.5 | 40.3 – 13.1 – 40.6 | Pass | 77.3 | –2.73 | 1.99 | 93.05 | 5.09 |
| 168-4 | 2.0 – 0 – 2.0 | 39.9 – 12.9 – 39.7 | Pass | 76.1 | –3.00 | 5.39 | 92.04 | 5.49 |

Figure 10:
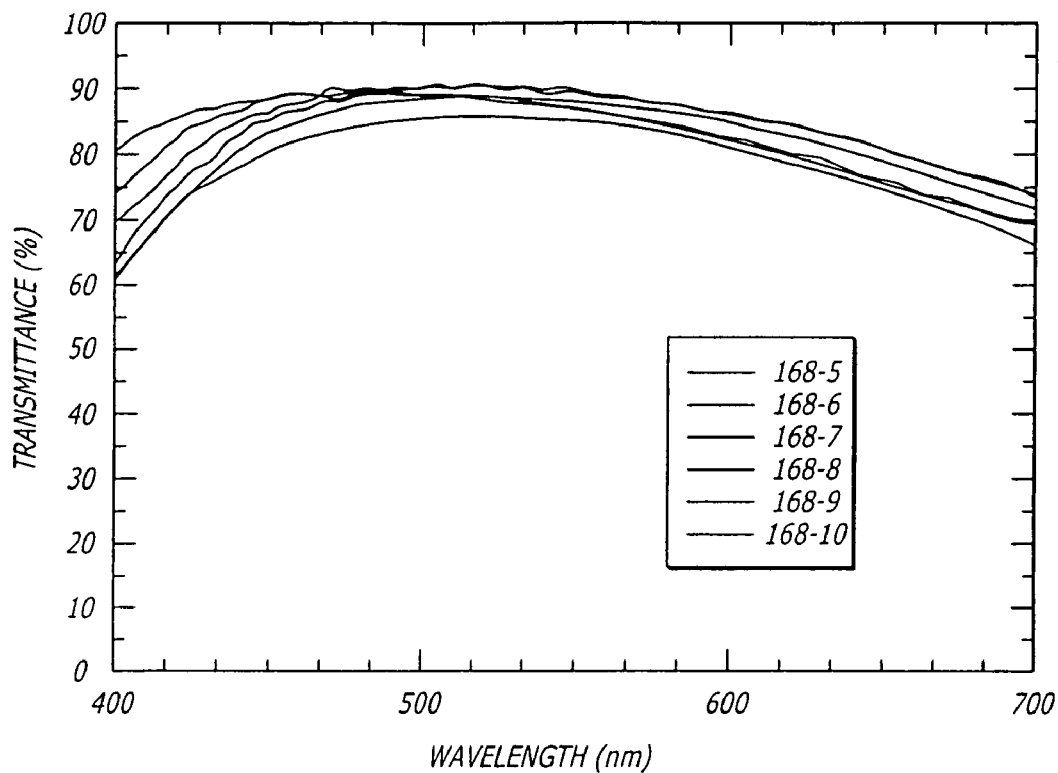
FIG. 10 is a graph showing the optical transmittance of additional samples InCeO/AgPdCu/InCeO films of Example 2 deposited on HC/Arton.

As can be seen, the data in Tables 15 and 16 show that the as-deposited and annealed ICO/APC/ICO films still have the sheet resistance above 5 ohm/sq. However, to form the high quality transparent electrodes, the ICO/APC/ICO film was required to be prepared with an optical transmittance above 90% and a sheet resistance below 5 ohm/sq. Therefore, deposition experiments for further reduction of the sheet resistance were performed by adjusting the thickness of the ICO and APC layers in the formation of ICO/APC/ICO films. Table 17 shows the thickness and properties of ICO/APC/ICO films synthesized in different power conditions. The transmittance curves measured from the films in Table 17 were shown in FIG. 10. To deposit the samples, the Ar and $O_2$ flow rates were kept at 10 sccm and 0.6 sccm in the deposition processes, except for sample 168–8 that was deposited at an $O_2$ flow rate of 1 sccm.

when the APC layer thickness is increased from 15 to 20 nm. Meanwhile, some of ICO/APC/ICO films still have a high optical transmittance above 90% if the ICO layer is thicker than 40 nm. It seems that the high transmittance above 90% and low sheet resistance below 5 ohm/sq can be reached with concurrently increasing thicknesses of both ICO and APC layers in the formation of ICO/APC/ICO films, as the data shown in Table 17 and FIG. 10. In addition, the variation of the layer thickness seems to have no obvious influence on the interlayer adhesion of ICO/APC/ICO films as all samples pass the IATs.

Figure 11:
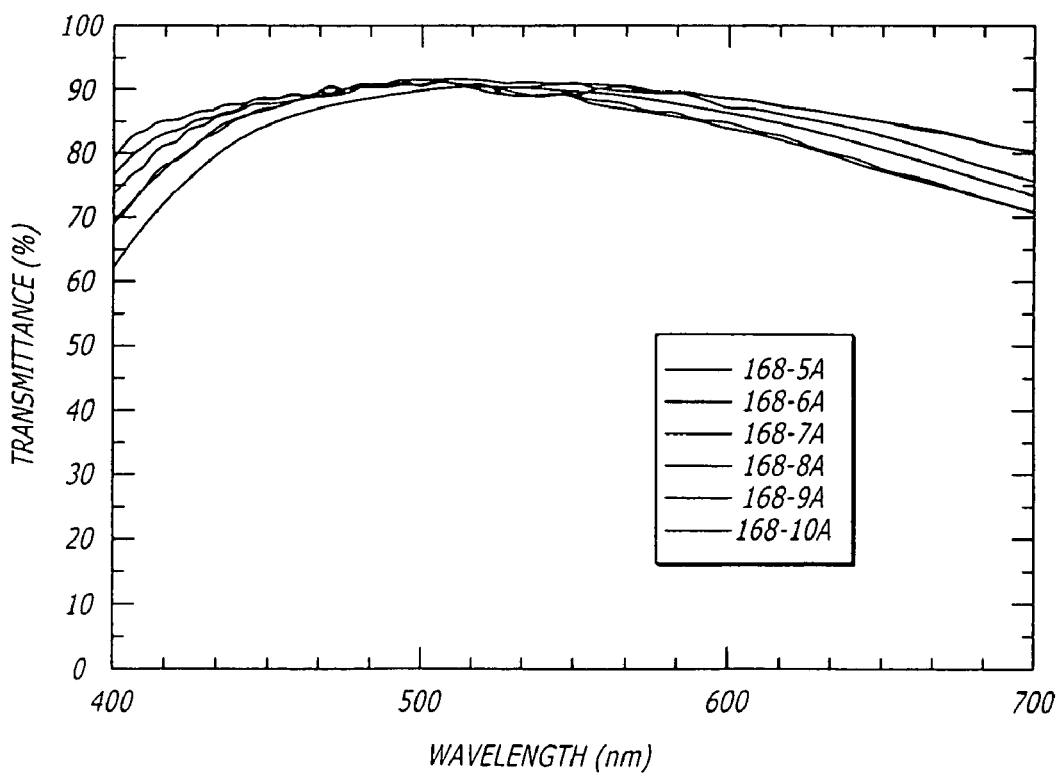
FIG. 11 is a graph showing the optical transmittance of additional annealed InCeO/AgPdCu/InCeO films of Example 2 deposited on HC/Arton.

Data in Table 18 show the properties measured from ICO/APC/ICO samples annealed at 145° C. for 2 hours. The transmittance of the annealed ICO/APC/ICO films is shown in FIG. 11.

TABLE 17

Properties of ICO/APC/ICO films on HC/Arton
ICO (top)-APC-ICO (bottom)

| Sample IDENTIFICATION CARD | Power (W) | Thickness (nm) | IAT (tape 810) | Color L | a | b | T % at 550 nm | Rs (Ω/sq) |
|---|---|---|---|---|---|---|---|---|
| 168-5 | 600-85-600 | 42.5-15.0-40.4 | Pass | 75.0 | −4.64 | 0.58 | 90.5 | 5.25 |
| 168-6 | 600-80-600 | 41.6-15.3-40.0 | Pass | 74.5 | −4.69 | 0.17 | 90.3 | 5.26 |
| 168-7 | 600-90-600 | 45.8-18.8-40.7 | Pass | 72.3 | −6.11 | 0.09 | 85.6 | 4.23 |
| 168-8 | 700-90-700 | 52.0-20.8-54.5 | Pass | 72.7 | −7.88 | 8.35 | 90.7 | 4.08 |
| 168-9 | 650-90-650 | 48.9-15.1-48.1 | Pass | 74.9 | −7.42 | 5.36 | 89.7 | 4.23 |
| 168-10 | 600-90-600 | | Pass | | | | 87.4 | 4.18 |

The data in Table 17 show that the sheet resistance of the ICO/APC/ICO films is decreased from 5.25 to 4.08 ohms/sq

TABLE 18

Properties of annealed ICO/APC/ICO films on HC/Arton
ICO (top) - APC - ICO (bottom)

| Sample IDENTIFICATION CARD | Power (W) | Thickness (nm) | IAT (tape 810) | Color L | a | b | T % at 550 nm | Rs (Ω/sq) |
|---|---|---|---|---|---|---|---|---|
| 168-5 | 600 – 85 – 600 | 42.5 – 15.0 – 40.4 | Pass | 77.1 | −5.24 | 3.69 | 91.9 | 5.50 |
| 168-6 | 600 – 80 – 600 | 41.6 – 15.3 – 40.0 | Pass | 77.3 | −6.18 | 3.32 | 91.8 | 4.23 |
| 168-7 | 600 – 90 – 600 | 45.8 – 18.8 – 40.7 | Pass | 75.0 | −6.35 | 1.66 | 89.1 | 4.24 |
| 168-8 | 700 – 90 – 700 | 52.0 – 20.8 – 54.5 | Pass | 75.8 | −7.77 | 5.83 | 90.3 | 4.21 |
| 168-9 | 650 – 90 – 650 | 48.9 – 15.1 – 48.1 | Pass | 77.0 | −6.09 | 3.79 | 91.5 | 3.80 |
| 168-10 | 600 – 90 – 600 | | Pass | 75.9 | −6.37 | 1.36 | 89.7 | 3.29 |

Compared with the data measured from the as deposited ICO/APC/ICO samples (Table 17 and FIG. 10), post annealing induces the further reduction of the sheet resistance to 3.29 ohm/sq and increase of both transmittance and brightness of the ICO/APC/ICO films. It is confirmed by the data in both Tables 17 and 18 that the ICO/APC/ICO films can be magnetron sputtered with the sheet resistance below 5 ohm/sq and transmittance above 90%.

IV. Aging Treatment

The as deposited and annealed ICO/APC/ICO samples have been aging treated at 60° C. and 90% RH for 500 hours. It was observed that there was no any defect or stain formed on the aged film surface, despite the films deposited at different parameters and after annealing treatment. Compared with the ICO/AAC/ICO films, the ICO/APC/ICO films seem to have the enhanced structure stability. This is based on the facts that the ICO/MC/ICO films deposited at oxygen flow rate above 1.6 sccm usually form the oxidized stains on the film surface during aging, while the ICO/APC/ICO films formed at the same conditions have no any stain after aging.

The aged ICO/APC/ICO samples were further characterized by comparing their optical and electrical properties with the un-aged samples. Table 19 lists the properties of the as-deposited and annealed ICO/APC/ICO films after aging treatment. It seems that pre-annealing has no influence on the properties of the aged ICO/APC/ICO films, as the data from aged samples and the annealed and aged samples shown in Table 19 are very close in values. As compared with the data in Table 15 and 17, the aged films have the reduced sheet resistance, and the increased transmittance and brightness. In addition, the properties measure from the aged ICO/APC/ICO films is very close to those measured from the annealed samples, as the data shown in Tables 16, 18, and 19.

V. Interlayer Adhesion

The interlayer adhesion test (IAT) was carried out on the as deposited, the annealed, and then the aged ICO/APC/ICO samples deposited under different conditions, using 3M tape 810. The results are listed in Tables 15–19, which show that all samples, with or without post treatment, pass the IATs. In order to further confirm the IAT results, all samples in Tables 15–19 were again tested by the cross-hatched IATs and the results were the same with the general IATs. FIGS. 13(*a*) and (*b*) show the averaged peel forces measured from both IAT and cross-hatched IAT on the aged and the annealed and aged ICO/APC/ICO films. It can be seen that the peel forces in two IAT methods are actually very close in values. In addition, it seems that the averaged peel force is reduced for the annealed and aged samples, as shown by comparing the data between FIGS. 13(*a*) and (*b*).

Figure 14:
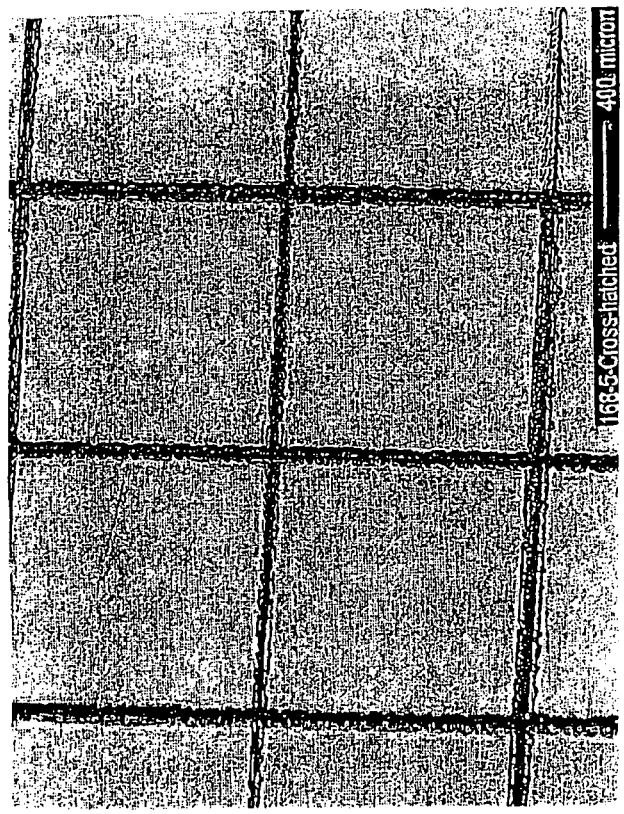
FIG. 14 is a photomicrograph showing the surface morphology of an InCeO/AgPdCu/InCeO film after cross-hatching and a peel test.

FIG. 14 shows a typical surface morphology of the ICO/APC/ICO film after cross-hatched and peel test. It can be seen that the film surface is clean and smooth. There is no observable damage or crack extended from the cross-hatched area. The results from the IATs indicated that the ICO/APC/ICO films exhibit a better interlayer adhesion than that of the ICO/AAC/ICO films, as the annealed and aged ICO/AAC/ICO samples were usually failed to pass the IATs with 3M tape 810. However, as all deposited ICO/APC/ICO samples with or without post annealing and/or aging totally pass the IAT with 3M tape 810, it may be necessary to continue the IATs with new or high adhesive tape, to evaluate the interlayer of the ICO/APC/ICO films more accurately.

VI. Conclusion

The ICO/APC/ICO films can be roll-to-roll deposited on HC/Arton with the sheet resistance below 5 ohm/sq, the transmittance above 90%, and the smooth and flat surface.

TABLE 19

Properties of aged, and annealed & aged ICO/APC/ICO films on HC/Arton
ICO (top) - APC - ICO (bottom)

| | Aged | | | | | | Annealed and aged | | | | | |
|---|---|---|---|---|---|---|---|---|---|---|---|---|
| | Color | | | T % | Rs | | Color | | | T % | Rs | |
| No | L | a | b | @ 550 nm | (Ω/sq) | IAT | L | a | b | @ 550 nm | (Ω/sq) | IAT |
| 168-1 | 77.2 | −5.22 | 1.30 | 92.26 | 5.74 | Pass | 77.2 | −4.22 | 1.90 | 92.67 | 4.73 | Pass |
| 168-2 | 77.7 | −3.22 | 1.98 | 92.89 | 5.58 | Pass | 77.7 | −3.30 | 3.51 | 90.27 | 5.58 | Pass |
| 168-3 | 77.8 | −4.34 | 1.98 | 93.98 | 5.06 | Pass | 77.6 | −3.44 | 3.66 | 92.66 | 5.26 | Pass |
| 168-4 | 77.3 | −3.42 | 2.63 | 92.58 | 4.58 | Pass | 76.1 | −3.67 | 3.38 | 93.20 | 5.20 | Pass |
| 168-5 | 76.2 | −5.90 | 1.50 | 90.56 | 4.71 | Pass | 77.5 | −5.55 | 2.97 | 92.72 | 4.21 | Pass |
| 168-6 | 75.2 | −5.36 | 0.69 | 90.22 | 4.78 | Pass | 75.3 | −5.11 | 1.89 | 90.53 | 4.55 | Pass |
| 168-7 | 72.7 | −7.73 | 0.26 | 87.16 | 3.74 | Pass | 72.4 | −8.87 | 2.32 | 88.29 | 3.80 | Pass |

Figure 12A:
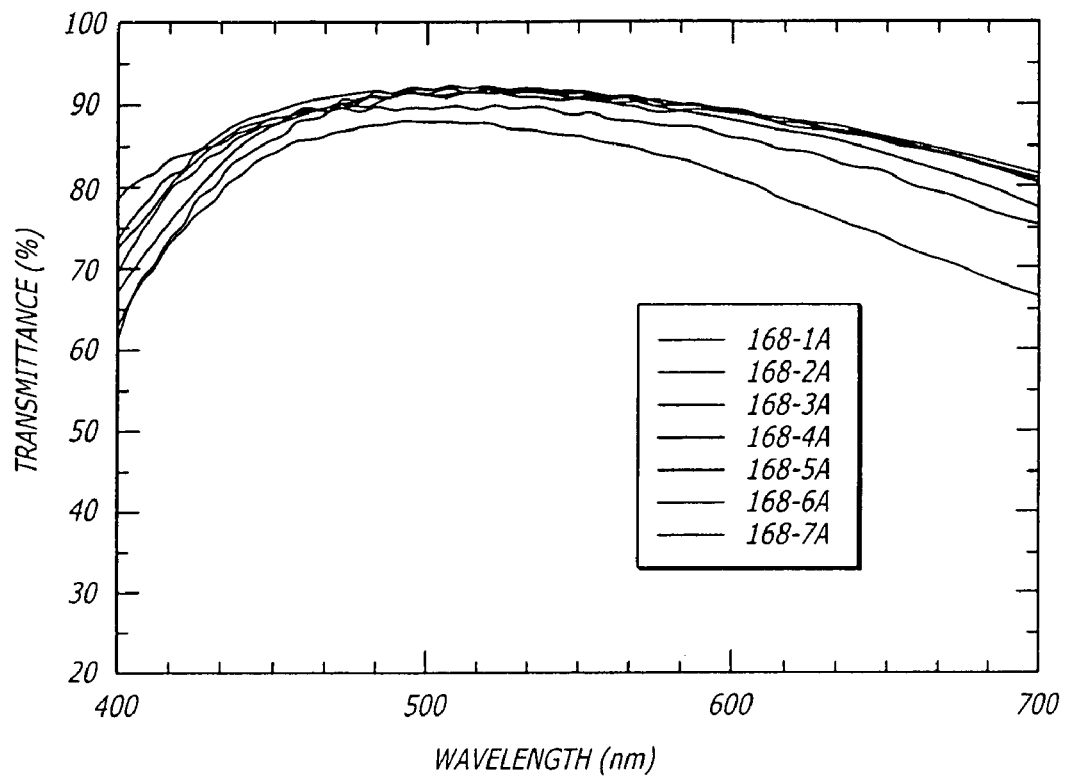
FIG. 12 is a graph showing the optical transmittance of (a) aged and (b) annealed and aged InCeO/AgPdCu/InCeO films of Example 2 deposited on HC/Arton.
Figure 12B:
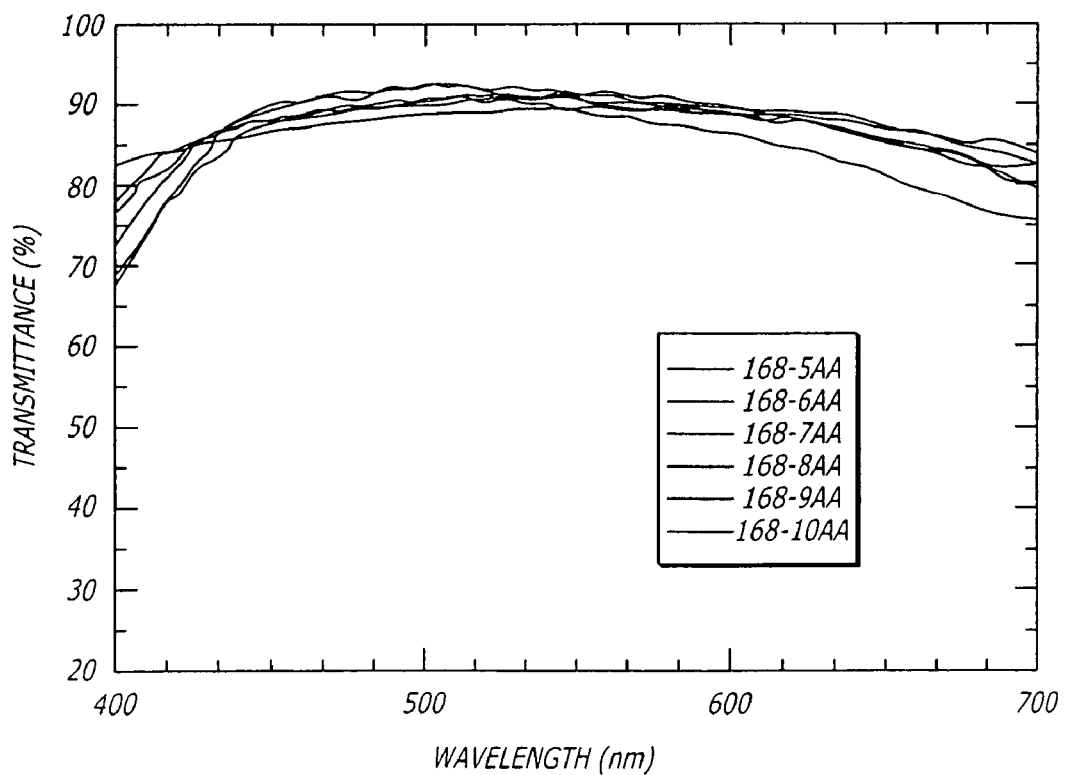

FIGS. 12(*a*) and (*b*) show the optical transmittance of the aged and the annealed and aged ICO/APC/ICO films. Aging treatment does not obviously affect the transparent behaviors of the InCeO/Ag/InCeO films, as the distribution of the transmittance curves in FIGS. 12(*a*) and (*b*) is similar to the curves in FIGS. 8–11.

AFM observation indicated that the aged ICO/APC/ICO films still have the smooth and flat surface and the RMS roughness similar to those of the un-aged ICO/APC/ICO films, despite the influence of the post-annealing.

Increasing $O_2$ flow rate in deposition of the ICO layers has no obvious influence on the film composition, but results in reduction of the growth rate of both ICO and APC layers in the process for the deposition of ICO/APC/ICO films.

Increasing $O_2$ flow rate induces the increase of the optical transmittance but has no effect on the sheet resistance of the ICO/APC/ICO films. Decreasing $O_2$ gas pressure promotes the formation of ICO/APC/ICO films with the improved surface smoothness.

The increase of the APC thickness results in the decrease of the sheet resistance of the ICO/APC/ICO films. High transmittance above 90% and low sheet resistance below 5 ohm/sq can be reached by concurrently increasing thickness of ICO layer, up to 50 nm, and APC layer, up to 18 nm, in the formation of ICO/APC/ICO films.

Post annealing induces the reduction of the sheet resistance down to 20%, and the increase of the brightness up to 2%. Post annealing also slightly increases the optical transmittance of ICO/APC/ICO films.

There is no observable defect or stain formed on the surface of the aged ICO/APC/ICO samples, despite the as-deposited or annealed films. The aged films have the reduced sheet resistance, and the increased transmittance and brightness. The pre-annealing has no influence on the properties of the aged ICO/APC/ICO films.

ICO/APC/ICO films exhibit the improved structure stability and the enhanced interlayer adhesion.

What is claimed is:

1. A method for forming a composite film comprising:
   (a) providing a flexible plastic substrate; and
   (b) depositing a multi-layered conductive metallic film continuously on the flexible plastic substrate by a thin-film deposition technique, the multi-layered conductive metallic film comprising two layers of indium cerium oxide (InCeO), each InCeO layer having a thickness from about 30 nm to about 45 nm, and a layer of an alloy of silver, palladium, and copper (Ag/Pd/Cu) having a thickness from about 12 nm to about 16 nm and deposited by sputtering a target including 98.0 atomic % silver, 0.5 atomic % palladium, and 1.5 atomic % copper, with the two layers of InCeO surrounding the layer of Ag/Pd/Cu and the composite film having a transmittance of at least about 90% at 550 nm.

2. The method of claim 1 wherein the InCeO layers are deposited by DC magnetron sputtering performed at a sputter power setting of from about 300 watts to about 2000 watts.

3. The method of claim 1 wherein the InCeO layers are sputtered by DC magnetron sputtering at a sputter power of from about 600 watts to about 800 watts, and the Ag/Pd/Cu layer is sputtered at a sputter power of from about 70 watts to about 90 watts.

4. The method of claim 1 wherein the deposition technique for making the InCeO layers is sputttering in an atmosphere containing argon and oxygen.

5. The method of claim 4 wherein the flow rate of oxygen is from about 0.2 to about 2.0 standard cubic centimillitor.

6. The method of claim 1 further comprising the step of collecting the composite films in continuous rolls using a line speed during deposition of up to about 4 feet/min.

7. The method of claim 6 wherein the line speed during deposition of the InCeO layers is from about 0.3 feet/min to about 1.2 feet/min.

8. The method of claim 7 wherein the line speed during deposition of the InCeO layers is from about 0.7 feet/mm to about 0.8 feet/min.

9. The method of claim 6 wherein the line speed during deposition of the layer of an alloy of silver, palladium, and copper is about 0.7 to about 0.8 feet/min.

10. The method of claim 1 further comprising the step of purging the surface of the flexible plastic substrate prior to film deposition, to enhance the adhesion of the film to the substrate.

11. The method of claim 10 wherein the step of purging the surface of the flexible plastic substrate prior to film deposition is performed with a plasma selected from the group consisting of the group of $Ar+O_2$, Ar, and $Ar+N_2$.

12. The method of claim 11 wherein the step of purging the surface of the flexible plastic substrate prior to film deposition is performed with an $Ar+O_2$ plasma.

13. The method of claim 1 wherein the flexible plastic substrate is selected from the group consisting of polyethylene terephthalate (PET), polyethylene naphthalate (PEN), polyethersulfone (PES), polycarbonate (PC), polysulfone, a phenolic resin, an epoxy resin, polyester, polyimide, polyetherester, polyetheramide, cellulose acetate, aliphatic polyurethanes, polyacrylonitrile, polytetrafluoroethylenes, polyvinylidene fluorides, poly(methyl a-methacrylates) and an aliphatic or cyclic polyolefin.

14. The method of claim 13 wherein the flexible plastic substrate is a cyclic polyolefin.

15. The method of claim 14 wherein the cyclic polyolefin is poly(bis(cyclopentadiene)).

16. The method of claim 13 wherein the flexible plastic substrate is a polyester.

17. The method of claim 16 wherein the polyester is an aromatic polyester.

18. The method of claim 13 wherein the flexible plastic substrate is reinforced with a hard coating.

19. The method of claim 18 wherein the hard coating is an acrylic coating.

20. The method of claim 18 wherein the hard coating improves the adhesion and smoothness of the composite film to the flexible plastic substrate.

21. The method of claim 1 wherein the method further comprises a post-deposition annealing step at ambient conditions.

22. The method of claim 21 wherein the post-deposition annealing step comprises annealing the film at a temperature of between about 130° C. to about 250° C. for from about 0.5 hour to about 2 hours.

23. The method of claim 21 wherein the post-deposition annealing step enhances the adhesion and smoothes the surface of the films, and induces the reduction of sheet resistance and the increase of both transmittance and brightness of the films.

24. The method of claim 1 wherein the flexible plastic substrate and the multi-layered conductive metallic film have a composition and a thickness adapted to produce a composite film having a brightness of at least about 80%.

25. The method of claim 1 wherein the flexible plastic substrate and the multi-layered conductive metallic film have a composition and a thickness adapted to produce a composite film having an electrical resistance of no greater than about 20 $\Omega$/square.

26. The method of claim 25 wherein the flexible plastic substrate and the multi-layered conductive metallic film have a composition and a thickness adapted to produce a composite film having an electrical resistance of no greater than about 10 $\Omega$/square.

27. The method of claim 26 wherein the flexible plastic substrate and the multi-layered conductive metallic film have a composition and a thickness adapted to produce a composite film having an electrical resistance of no greater than about 5 $\Omega$/square.

28. The method of claim 1 wherein the multi-layered conductive metallic film has a root-mean square roughness of no greater than about 2.5 nm.

29. The method of claim 28 further comprising a post-deposition annealing step and wherein multi-layered conductive metallic film has a root-mean-square roughness of no greater than about 1.5 nm.

30. The method of claim 1 wherein the flexible plastic substrate and the multi-layered conductive metallic film have a composition and a thickness adapted to produce a composite film being stable to a 500-hour exposure at 60° C. and 90% relative humidity.

31. The method of claim 1 wherein the flexible plastic substrate and the multi-layered conductive metallic film have a composition and a thickness adapted to produce a composite film having an interlayer adhesion sufficiently great to pass an ASTM 3359B standard 180° C. peel adhesion test.

32. The method of claim 1 wherein the flexible plastic substrate and the multi-layered conductive metallic film have a composition and a thickness adapted to produce a composite film being wet and dry etchable.

33. The method of claim 1 further comprising depositing a hard coating having a composition and a thickness adapted to produce a composite film being laser etchable.

34. The method of claim 1 wherein the flexible plastic substrate and the multi-layered conductive metallic film have a composition and a thickness adapted to produce a composite film having a brightness L of at least about 80.0%, a red to green shift a of between about 0 and about 7.00 and a blue to yellow shift b of between about 0 and about 7.00.

35. The method of claim 1 wherein the sputtering is the sputtering is the DC magnetron sputtering.

36. The method of claim 35 wherein said sputtering is at a sputter power of from about 60 watts to about 100 watts.

37. The method of claim 35 wherein the deposition distance for DC magnetron sputtering is from about 2 inches to about 12 inches.

38. The method of claim 37 wherein the deposition distance for DC magnetron sputtering is from about 9 inches to about 11 inches.

39. The method of claim 35 wherein the DC magnetron sputtering is performed in an atmosphere that contains argon.

40. The method of claim 39 wherein the flow rate of argon is from about 5.0 to about 20.0 standard cubic centimillitor.

41. The method of claim 40 wherein the flow rate of argon is about 10.0 standard cubic centimillitor.

* * * * *